(12) United States Patent
Son et al.

(10) Patent No.: US 11,757,179 B2
(45) Date of Patent: Sep. 12, 2023

(54) ANTENNA STRUCTURE AND ELECTRONIC DEVICE INCLUDING THE SAME

(71) Applicant: Samsung Electronics Co., Ltd., Gyeonggi-do (KR)

(72) Inventors: Cheolhong Son, Gyeonggi-do (KR); Kyungjae Lee, Gyeonggi-do (KR); Sangha Lee, Gyeonggi-do (KR); Soonho Hwang, Gyeonggi-do (KR); Sungjun Lee, Gyeonggi-do (KR); Hyunjeong Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 357 days.

(21) Appl. No.: 17/090,459

(22) Filed: Nov. 5, 2020

(65) Prior Publication Data

US 2021/0135351 A1    May 6, 2021

(30) Foreign Application Priority Data

Nov. 5, 2019    (KR) .......................... 10-2019-0140186

(51) Int. Cl.
| | | |
|---|---|---|
| *H01Q 1/24* | (2006.01) |
| *H01Q 1/48* | (2006.01) |
| *H01Q 5/328* | (2015.01) |
| *H01Q 5/40* | (2015.01) |
| *H05K 1/18* | (2006.01) |

(52) U.S. Cl.
CPC .............. *H01Q 1/48* (2013.01); *H01Q 1/243* (2013.01); *H01Q 5/328* (2015.01); *H01Q 5/40* (2015.01);
(Continued)

(58) Field of Classification Search
CPC .............. H01Q 1/243; H01Q 1/48–50; H01Q 5/30–40; H01Q 5/307–328
See application file for complete search history.

(56) References Cited

U.S. PATENT DOCUMENTS

| | | | |
|---|---|---|---|
| 7,079,079 B2* | 7/2006 | Jo ........................ | H01Q 9/0421 343/702 |
| 9,905,911 B2* | 2/2018 | Chen ...................... | H01Q 9/42 |

(Continued)

FOREIGN PATENT DOCUMENTS

| | | |
|---|---|---|
| CN | 109687110 | 4/2019 |
| KR | 1020170013677 | 2/2017 |

(Continued)

OTHER PUBLICATIONS

International Search Report dated Feb. 25, 2021 issued in counterpart application No. PCT/KR2020/015371, 10 pages.

*Primary Examiner* — Hasan Islam
(74) *Attorney, Agent, or Firm* — The Farrell Law Firm, P.C.

(57) ABSTRACT

An electronic device includes a housing including a front plate, a rear plate facing away from the front plate, and a side member surrounding a space between the front plate and the rear plate and connecting one side of the front plate to one side of the rear plate, an antenna structure including at least part of the conductive portion, and a printed circuit board disposed in the space and including at least one processor. At least part of the side member is a conductive portion. The conductive portion includes a first conductive pattern, a second conductive pattern disposed at least partially coupled to the first conductive pattern, and a third conductive pattern disposed at least partially coupled to the first conductive pattern and spaced apart from the second conductive pattern. The antenna structure includes a first feeding part electrically connected to a first location of the first conductive pattern, a second feeding part electrically connected to a second location of the first conductive pattern, wherein the second location is closer to the third conductive pattern than the first location, a first ground part electrically connected to a third location between the first location and the second (Continued)

location of the first conductive pattern, a second ground part electrically connected to a fourth location between the second location and the third location of the first conductive pattern, a switch electrically connected to a fifth location between the first location and the third location of the first conductive pattern, a third ground part electrically connected to a sixth location of the second conductive pattern, and a fourth ground part electrically connected to a seventh location of the third conductive pattern.

20 Claims, 12 Drawing Sheets

(52) U.S. Cl.
CPC ..... *H05K 1/18* (2013.01); *H05K 2201/10098* (2013.01)

(56) References Cited

U.S. PATENT DOCUMENTS

| | | |
|---|---|---|
| 10,439,268 B2 | 10/2019 | Son et al. |
| 10,516,772 B2 | 12/2019 | Lee et al. |
| 10,651,542 B2 | 5/2020 | Choi et al. |
| 11,050,863 B2 | 6/2021 | Lee et al. |
| 11,101,827 B2 | 8/2021 | Kim et al. |
| 2014/0132457 A1* | 5/2014 | Galeev ............ H01Q 1/48 |
| | | 343/702 |
| 2017/0033441 A1 | 2/2017 | Son et al. |
| 2017/0048363 A1* | 2/2017 | Lee ............ H01Q 5/328 |
| 2017/0187111 A1 | 6/2017 | Noh et al. |
| 2018/0026361 A1 | 1/2018 | Sakong et al. |
| 2018/0069301 A1 | 3/2018 | Choi et al. |
| 2020/0274229 A1 | 8/2020 | Choi et al. |
| 2020/0321988 A1 | 10/2020 | Kim et al. |
| 2021/0274027 A1 | 9/2021 | Lee et al. |
| 2022/0123469 A1* | 4/2022 | Hsu ............ H01Q 9/42 |
| 2022/0344807 A1* | 10/2022 | You ............ H01Q 9/42 |

FOREIGN PATENT DOCUMENTS

| | | |
|---|---|---|
| KR | 1020170020013 | 2/2017 |
| KR | 1020180010957 | 1/2018 |
| KR | 1020190089375 | 7/2019 |
| KR | 10-2020-0101234 | 8/2020 |

* cited by examiner

ANTENNA STRUCTURE AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2019-0140186, filed on Nov. 5, 2019, in the Korean Intellectual Property Office, the disclosure of which is incorporated by reference herein its entirety.

BACKGROUND

1. Field

The disclosure relates generally to an antenna structure and an electronic device including the same.

2. Description of Related Art

With the development of communication technologies, electronic devices equipped with antennas are supplied widely. When the housing of the electronic device includes a conductive pattern such as a metal frame, an antenna may be implemented using the conductive pattern of the housing. The electronic device may transmit and/or receive an RF signal including audio signals or data (e.g., messages, photos, videos, music files, or games) using an antenna.

The antenna may simultaneously transmit and receive signals belonging to different frequency bands, using a plurality of frequency bands. The electronic device may service a global communication band, using signals belonging to different frequency bands. For example, the electronic device may perform communication using a signal belonging to a low band (LB) frequency (e.g., a global positioning system (GPS) frequency band, a legacy frequency band, or a wireless fidelity (Wi-Fi)1 frequency band) and/or perform communication using a signal belonging to a high band (HB) frequency (e.g., a Wi-Fi2 frequency band) at the same time.

An electronic device may include an antenna structure, to which a switching structure is applied, to transmit and receive signals belonging to different frequency bands. The antenna structure may use an open loop type switching structure to simultaneously support different frequency bands. For example, the open loop type may be a switching structure in which a feeding part, a ground part, and a switch are connected to a conductive pattern. The open loop type may support different frequency bands, using the current flow flowing from the feeding part to the switch and the current flowing from the feeding part to the ground part.

With the introduction of fifth generation (5G) communication, the electronic device may support new frequency bands such as millimeter wave (mmWave) and/or 5G new radio (NR). In addition, as the performance of electronic devices is developed, the sizes and/or arrangement number of electric objects, such as cameras and/or speakers, may increase. As a result, the space in which an antenna structure is capable of being implemented in the electronic device may decrease, but the number of conductive patterns included in the antenna structure may increase.

In the open loop type switching structure, it is easy to transmit and receive signals in a low frequency band, but it is more difficult to transmit and receive signals in a high frequency band. In addition, the open loop type switching structure may only implement a limited number of frequency bands as compared to the volume and/or surface area of the antenna structure.

SUMMARY

The present disclosure has been made to address the above-mentioned problems and disadvantages, and to provide at least the advantages described below.

In accordance with an aspect of the disclosure, an electronic device includes a housing including a front plate, a rear plate facing away from the front plate, and a side member surrounding a space between the front plate and the rear plate and connecting one side of the front plate to one side of the rear plate, an antenna structure including at least part of the conductive portion, and a printed circuit board disposed in the space and including at least one processor. At least part of the side member is a conductive portion. The conductive portion includes a first conductive pattern, a second conductive pattern disposed at least partially coupled to the first conductive pattern, and a third conductive pattern disposed at least partially coupled to the first conductive pattern and spaced apart from the second conductive pattern. The antenna structure may include a first feeding part electrically connected to a first location of the first conductive pattern, a second feeding part electrically connected to a second location of the first conductive pattern, wherein the second location is closer to the third conductive pattern than the first location, a first ground part electrically connected to a third location between the first location and the second location of the first conductive pattern, a second ground part electrically connected to a fourth location between the second location and the third location of the first conductive pattern, a switch electrically connected to a fifth location between the first location and the third location of the first conductive pattern, a third ground part electrically connected to a sixth location of the second conductive pattern, and a fourth ground part electrically connected to a seventh location of the third conductive pattern.

In accordance with another aspect of the disclosure, an electronic device includes a conductive portion and an antenna structure including at least part of the conductive portion. The conductive portion includes a first conductive pattern, a second conductive pattern disposed at least partially coupled to the first conductive pattern, and a third conductive pattern disposed at least partially coupled to the first conductive pattern and spaced apart from the second conductive pattern. The antenna structure includes a first feeding part connected to a portion adjacent to the second conductive pattern, in the first conductive pattern, a second feeding part connected to a portion adjacent to the third conductive pattern, in the first conductive pattern, at least one or more ground parts connected to a portion between the first feeding part and the second feeding part of the first conductive pattern, and a switch electrically connected to a portion between the first feeding part and the at least one or more ground parts of the first conductive pattern. A frequency band, to which a signal transmitted and received by the first feeding part and the switch belongs, is higher than a frequency band to which a signal transmitted and received by the first feeding part and the at least one or more ground parts belongs.

In accordance with another aspect of the disclosure, an electronic device includes a housing including a front plate, a rear plate facing away from the front plate, and a side member surrounding a space between the front plate and the rear plate and connecting one side of the front plate to one side of the rear plate, an antenna structure including at least part of the conductive portion, and a printed circuit board disposed in the space and including at least one processor. At least part of the side member is a conductive portion. The conductive portion includes a first conductive pattern, a second conductive pattern disposed at least partially coupled to the first conductive pattern, and a third conductive pattern disposed at least partially coupled to the first conductive pattern and spaced apart from the second conductive pattern. The antenna structure includes a first feeding part electrically connected to a first location of the first conductive pattern, a second feeding part electrically connected to a second location of the first conductive pattern, wherein the second location is closer to the third conductive pattern than the first location, a first ground part electrically connected to a third location between the first location and the second location of the first conductive pattern, a second ground part electrically connected to a fourth location between the second location and the third location of the first conductive pattern, and a switch electrically connected to a fifth location between the first location and the third location of the first conductive pattern. The first feeding part transmits and receives a signal in a first frequency band with the first ground part by forming a first current flow. The second feeding part transmits and receives a signal in a second frequency band different from the first frequency band with the second ground part by forming a second current flow. The first feeding part transmits and receive a signal in a third frequency band different from the first frequency band and the second frequency band with the switch by forming a third current flow.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
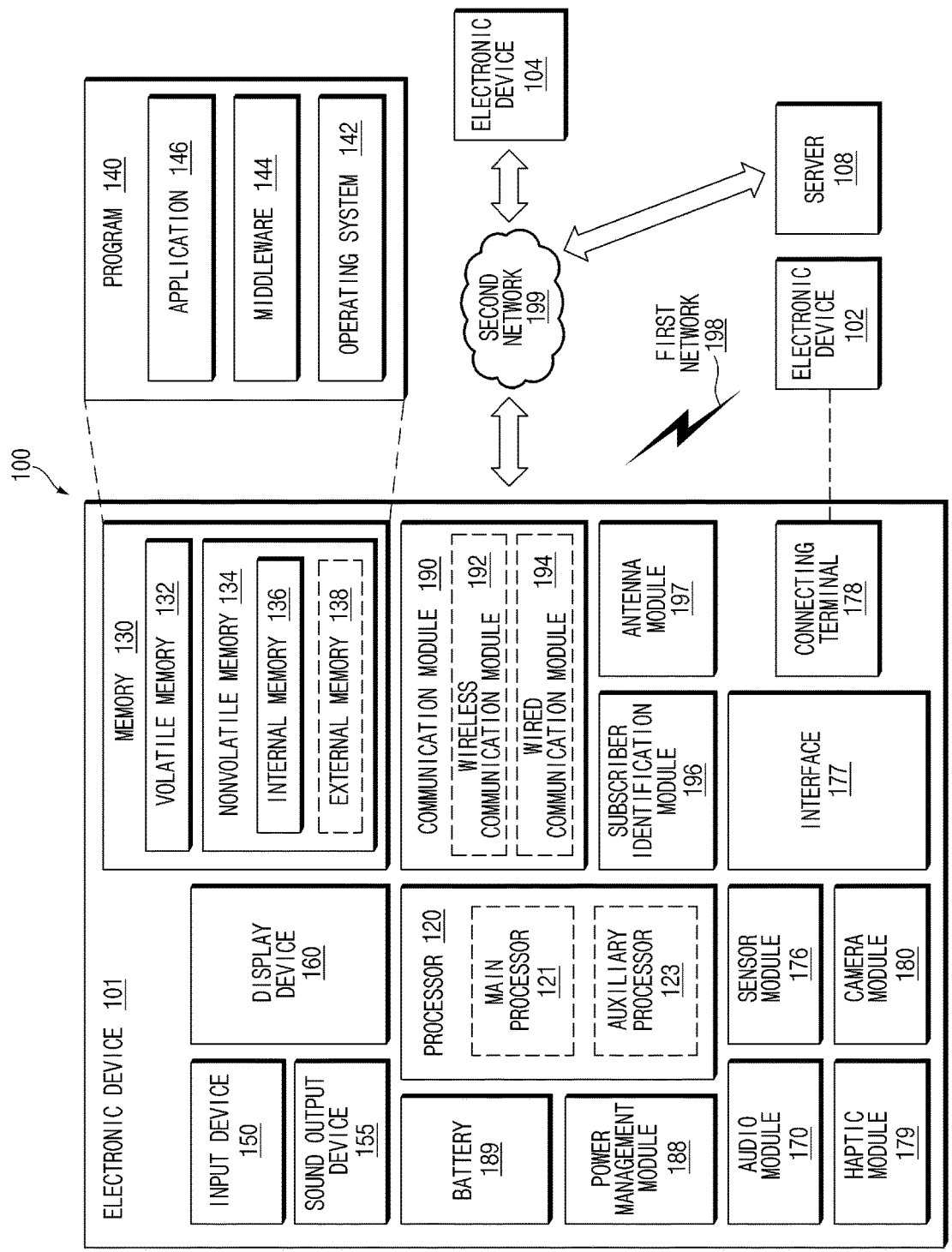
FIG. 1 is a block diagram illustrating an electronic device in a network environment, according to an embodiment.

Various embodiments of the disclosure are described with reference to the accompanying drawings. However, various embodiments of the disclosure are not limited to particular embodiments, and it should be understood that modifications, equivalents, and/or alternatives of the embodiments described herein can be variously made. With regard to description of drawings, similar components may be marked by similar reference numerals.

Accordingly, an aspect of the disclosure is to provide an antenna structure capable of simultaneously transmitting and receiving signals belonging to a low frequency band and signals belonging to a high frequency band without increasing the number of conductive patterns, and an electronic device including the same.

FIG. 1 is a block diagram illustrating an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
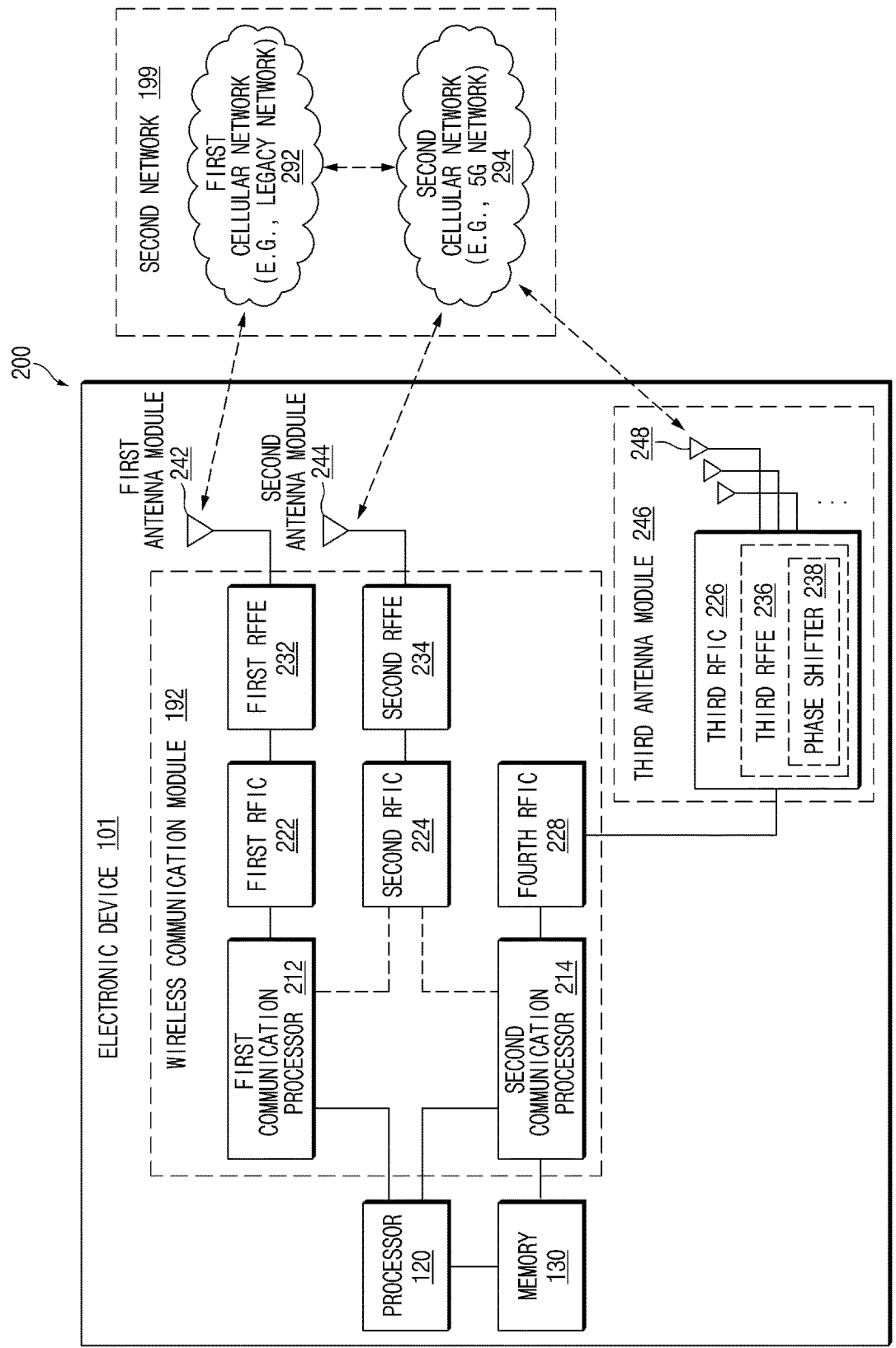
FIG. 2 is a block diagram of an electronic device for supporting legacy network communication and 5G network communication, according to an embodiment.

FIG. 2 is a block diagram 200 of an electronic device 101 for supporting legacy network communication and 5G network communication, according to an embodiment.

Referring to FIG. 2, the electronic device 101 includes a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 further includes the processor 120 and the memory 130. A network 199 may include a first network 292 and a second network 294. The electronic device 101 may further include at least one additional component, and the network 199 may further include at least another network. The first communication processor 212, the second communication processor 214, the first RFIC 222, the second RFIC 224, the fourth RFIC 228, the first RFFE 232, and the second RFFE 234 may form at least part of a wireless communication module 192. The fourth RFIC 228 may be omitted or may be included as a part of the third RFIC 226.

The first communication processor 212 may establish a communication channel for a band to be used for wireless communication with the first network 292 and may support legacy network communication through the established communication channel. The first network may be a legacy network including a second generation (2G), third generation 3G, fourth generation 4G, or long term evolution (LTE) network. The second communication processor 214 may establish a communication channel corresponding to a specified band (e.g., ranging from approximately 6 gigahertz (GHz) to approximately 60 GHz) of bands to be used for wireless communication with the second network 294 and may support 5G network communication through the established communication channel. The second network 294 may be a 5G network defined in $3^{rd}$ Generation Partnership Project (3GPP). Additionally, the first communication processor 212 or the second communication processor 214 may establish a communication channel corresponding to another specified band (e.g., approximately 6 GHz or lower) of the bands to be used for wireless communication with the second network 294 and may support 5G network communication through the established communication channel. The first communication processor 212 and the second communication processor 214 may be implemented within a single chip or a single package together with the processor 120, the auxiliary processor 123, or the communication module 190. For example, the processor 120 and the first communication processor 212 may be coupled with each other; alternatively, the processor 120 and the second communication processor 214 may be coupled with each other.

In the case of transmitting a signal, the first RFIC 222 may convert a baseband signal generated by the first communication processor 212 into a radio frequency (RF) signal of approximately 700 megahertz (MHz) to approximately 3 GHz that is used in the first network 292 (e.g., a legacy network). In the case of receiving a signal, an RF signal may be obtained from the first network 292 (e.g., a legacy network) through an antenna (e.g., the first antenna module 242) and may be pre-processed through an RFFE (e.g., the first RFFE 232). The first RFIC 222 may convert the preprocessed RF signal to a baseband signal so as to be processed by the first communication processor 212.

In the case of transmitting a signal, the second RFIC 224 may convert a baseband signal generated by the first communication processor 212 or the second communication processor 214 into an RF signal (hereinafter referred to as a "5G Sub6 RF signal") in a Sub6 band (e.g., approximately 6 GHz or lower) used in the second network 294 (e.g., a 5G network). In the case of receiving a signal, the 5G Sub6 RF signal may be obtained from the second network 294 (e.g., a 5G network) through an antenna (e.g., the second antenna module 244) and may be pre-processed through an RFFE (e.g., the second RFFE 234). The second RFIC 224 may convert the pre-processed 5G Sub6 RF signal into a baseband signal so as to be processed by a corresponding communication processor of the first communication processor 212 or the second communication processor 214.

The third RFIC 226 may convert a baseband signal generated by the second communication processor 214 into an RF signal (hereinafter referred to as a "5G Above6 RF signal") in a 5G Above6 band (e.g., approximately 6 GHz to approximately 60 GHz) to be used in the second network 294 (e.g., a 5G network). In the case of receiving a signal, the 5G Above6 RF signal may be obtained from the second network 294 through an antenna 248, may be pre-processed through a third RFFE 236, and may be converted to an intermediate frequency (IF) signal (e.g., about 13 GHz to about 17 GHz). The third RFIC 226 may convert the converted IF signal to a baseband signal to be processed by the second communication processor 214. The third RFFE 236 may be implemented as a part of the third RFIC 226.

The electronic device 101 may further include a fourth RFIC 228. As illustrated in FIG. 2, the fourth RFIC 228 may be formed separately from the third RFIC 226. Alternatively, the fourth RFIC 228 may be included in the third RFIC 226. The fourth RFIC 228 may be directly connected to the processor 120 through a peripheral component interconnect express (PCIe). The fourth RFIC 228 may convert a baseband signal generated by the second communication processor 214 into an RF signal (hereinafter referred to as an "IF signal") in an IF band (e.g., ranging from about 9 GHz to about 11 GHz) and may provide the IF signal to the third RFIC 226. The third RFIC 226 may convert the IF signal into a 5G Above6 RF signal. In the case of receiving a signal, the 5G Above6 RF signal may be received from the second network 294 through an antenna 248 and may be converted into an IF signal by the third RFIC 226. The fourth RFIC 228 may convert the IF signal into a baseband signal to be processed by the second communication processor 214.

The first RFIC 222 and the second RFIC 224 may be implemented as at least part of a single package or a single chip. The first RFFE 232 and the second RFFE 234 may be implemented as at least part of a single chip or a single package. At least one of the first antenna module 242 or the second antenna module 244 may be omitted or may be combined with any other antenna module to process RF signals in a plurality of bands.

The third RFIC 226 and the antenna 248 may be disposed on the same substrate to form the third antenna module 246. For example, the wireless communication module 192 or the processor 120 may be disposed at a first substrate (e.g., a main printed circuit board). In this case, the third RFIC 226 may be disposed in a partial region (e.g., a bottom surface) of a second substrate (e.g., a sub printed circuit board) separate from the first substrate; the antenna 248 may be disposed in another partial region (e.g., an upper surface), and thus the third antenna module 246 may be formed. The antenna 248 may include, for example, an antenna array capable of being used for beamforming. As the third RFIC 226 and the antenna 248 are disposed at the same substrate, it may be possible to decrease a length of a transmission line between the third RFIC 226 and the antenna 248. The decrease in the transmission line may make it possible to prevent a signal in a high-frequency band (e.g., approximately 6 GHz to approximately 60 GHz) used for the 5G network communication from being lost (or attenuated) due to the transmission line. As such, the electronic device 101 may improve the quality or speed of communication with the second network 294.

The second network 294 (e.g., a 5G network) may be used independently of the first network 292 (e.g., a legacy network) (e.g., a stand-alone (SA) network) or may be used in conjunction with the first network 292 (e.g., a non-stand-alone (NSA) network). For example, only an access network (e.g., a 5G radio access network (RAN) or a next generation RAN (NG RAN)) may be present in the 5G network, and a core network (e.g., a next generation core (NGC)) may be absent from the 5G network. In this case, the electronic device 101 may access the access network of the 5G network and may then access an external network (e.g., Internet) under control of a core network (e.g., an evolved packed core (EPC)) of the legacy network. Protocol information (e.g., LTE protocol information) for communication with the legacy network or protocol information (e.g., NR protocol information) for communication with the 5G network may be stored in the memory 130 so as to be accessed by any other component (e.g., the processor 120, the first communication processor 212, or the second communication processor 214).

Figure 3:
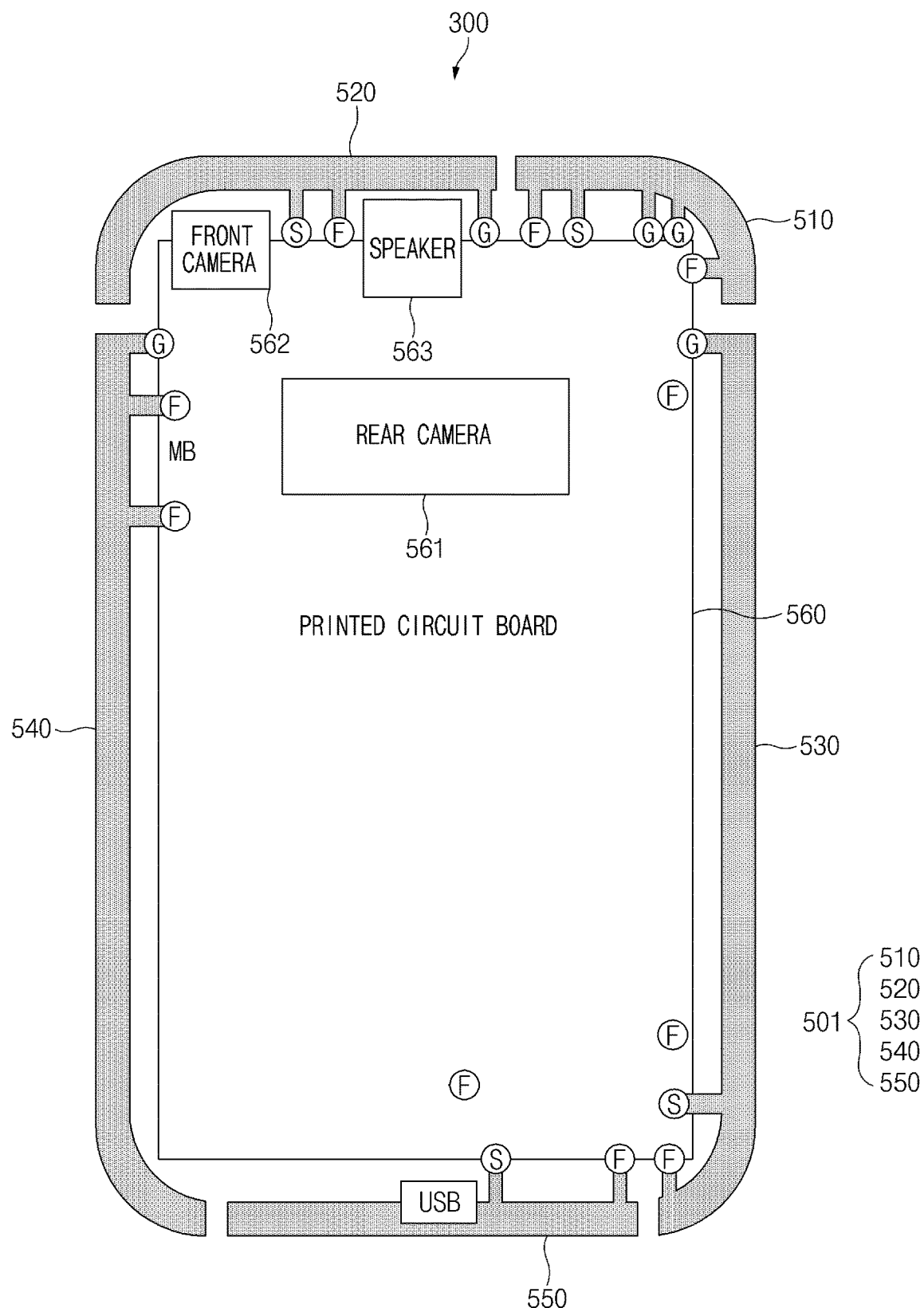
FIG. 3 is a diagram illustrating types of signals transmitted and received by an electronic device, according to an embodiment.

FIG. 3 is a diagram 300 illustrating types of signals transmitted and received by an electronic device 101, according to an embodiment. The electronic device 101 may include a housing, an antenna structure 501, and/or a printed circuit board 560.

The housing may comprise a front plate, a rear plate, and/or a side member. The front plate may be disposed to face the front side of the electronic device 101 to cover the front side of the electronic device 101. The rear plate may be disposed to face the opposite direction to the front plate. The side member may be disposed to surround the space between the front plate and the rear plate. The side member may connect one side of the front plate to one side of the rear plate. For example, at least part of the side member may be a first conductive pattern (or portion) 510, a second conductive pattern 520, a third conductive pattern 530, a fourth conductive pattern 540, and a fifth conductive pattern 550. The housing may form a space inside the electronic device 101 and may protect the electronic device 101 from external impact.

Referring to FIG. 3, the antenna structure 501 may include at least part of the first conductive pattern 510, the second conductive pattern 520, the third conductive pattern 530, the fourth conductive pattern 540, and the fifth conductive pattern 550. The antenna structure 501 may transmit and receive signals belonging to a plurality of frequency bands, using the first conductive pattern 510, the second conductive pattern 520, the third conductive pattern 530, the fourth conductive pattern 540, and the fifth conductive pattern 550. For example, the antenna structure 501 may transmit and receive signals belonging to a low frequency band (e.g., a GPS frequency band, a Wi-Fi1 frequency band, or an LB frequency), using at least part of the first conductive pattern 510 and the second conductive pattern 520. Additionally or alternatively, the antenna structure 501 may transmit or receive signals belonging to an IF band (a middle band (MB) frequency), using the third conductive pattern 530 and the fourth conductive pattern 540 of the conductive portion. In addition, the antenna structure 501 may transmit and receive signals belonging to a high-frequency band (e.g., a Wi-Fi2 frequency band or a 5G NR frequency band), using the first conductive pattern 510 and the third conductive pattern 530 of the conductive portion.

The printed circuit board 560 may be disposed in a space. At least one processor 120 may be disposed on the printed circuit board 560. The printed circuit board 560 may be electrically connected to a plurality of electric objects such as a rear camera 561, a front camera 562, and/or a speaker 563. For the processor 120 to deliver a plurality of generated electric object signals, the printed circuit board 560 may include a plurality of wires electrically connecting the processor 120 to each of a plurality of electric objects.

The second conductive pattern 520 may be disposed to be at least partially coupled to the first conductive pattern 510. The third conductive pattern 530 may be disposed to be at least partially coupled to the first conductive pattern 510. The third conductive pattern 530 may be disposed to be spaced apart from the second conductive pattern 520.

The fourth conductive pattern 540 may be disposed to be spaced apart from the second conductive pattern 520. The fourth conductive pattern 540 may be disposed on the opposite side of the third conductive pattern 530 with respect to the printed circuit board 560. The fifth conductive pattern 550 may be interposed between the third conductive pattern 530 and the fourth conductive pattern 540.

The first conductive pattern 510, the second conductive pattern 520, the third conductive pattern 530, the fourth conductive pattern 540, and the fifth conductive pattern 550 may be connected to at least one feeding part (F). A feeding part (F) may be connected to a wireless communication circuit 192 disposed on the printed circuit board 560. The first conductive pattern 510, the second conductive pattern 520, the third conductive pattern 530, the fourth conductive pattern 540, and the fifth conductive pattern 550 may be connected to a wireless communication circuit through a feeding part (F). Accordingly, the wireless communication circuit may transmit and receive a wireless signal through the first conductive pattern 510, the second conductive pattern 520, the third conductive pattern 530, the fourth conductive pattern 540, and the fifth conductive pattern 550, and a feeding part (F). The first conductive pattern 510, the second conductive pattern 520, the third conductive pattern 530, the fourth conductive pattern 540, and the fifth conductive pattern 550 may transmit and receive signals belonging to a plurality of frequency bands (e.g., a GPS frequency band, a Wi-Fi1 frequency band, an LB frequency band, an MB frequency band, a Wi-Fi2 frequency band, or a 5G NR frequency band).

Additionally, the electronic device 101 may include at least one ground structure (G) to connect the first conductive pattern 510, the second conductive pattern 520, the third conductive pattern 530, the fourth conductive pattern 540, and/or the fifth conductive pattern 550 to a ground layer.

In addition, the electronic device 1010 may include at least one switch (S) interposed between at least one feeding part (F) and at least one ground structure (G).

To improve the communication performance of a high frequency band (e.g., a 5G frequency band), the antenna structure 501 of the electronic device 101 may apply a four antenna reception (4Rx)-diversity technology including four portions receiving signals. However, the antenna structure 501 may need to maintain the specified number of antennas in a portion supporting a low frequency band (e.g., a legacy frequency band). Accordingly, it may not be easy to design the antenna structure 501 supporting an additional high frequency band (e.g., a 5G NR frequency band) in the limited space of the electronic device 101.

The antenna structure 501 may include the structure of the first conductive pattern 510, the second conductive pattern 520, and/or the third conductive pattern 530 for transmitting and receiving signals in a low frequency band. The antenna structure 501 may increase the space utilization of the antenna structure 501 by implementing an additional high frequency band without separately adding a conductive pattern.

The electronic device 101 having the housing of a metal frame structure may implement the antenna structure 501, using the metal frame structure. For example, the antenna structure 501 may support frequency bands such as a GPS frequency band, an MB frequency, an HB frequency, and/or a 5G NR frequency band, using the first conductive pattern 510 that is a metal frame. The antenna structure 501 may support an LB frequency or a 5G NR frequency band, using at least part of the second conductive pattern 520 and the fourth conductive pattern 540 that are metal frames. In another example, the fourth conductive pattern 540 may support the MB frequency and HB frequency. In another example, the antenna structure 501 may support the Wi-Fi1 frequency band, using the first conductive pattern 510 and the third conductive pattern 530. The antenna structure 501 may support Wi-Fi2 frequency band, using the third conductive pattern 530.

The antenna structure 501 may additionally implement a 5G NR frequency band by applying a switch (S) to a closed loop structure, in which a feed structure (i.e., the structure of a feeding part (F)) is applied at opposite ends of the first conductive pattern 510. Accordingly, it is possible to implement a radiator capable of radiating signals from the legacy band, which is a frequency band that has been previously used, to the 5G NR high frequency band by using a single metal frame in the electronic device 101 having a metal frame structure.

Figure 4:
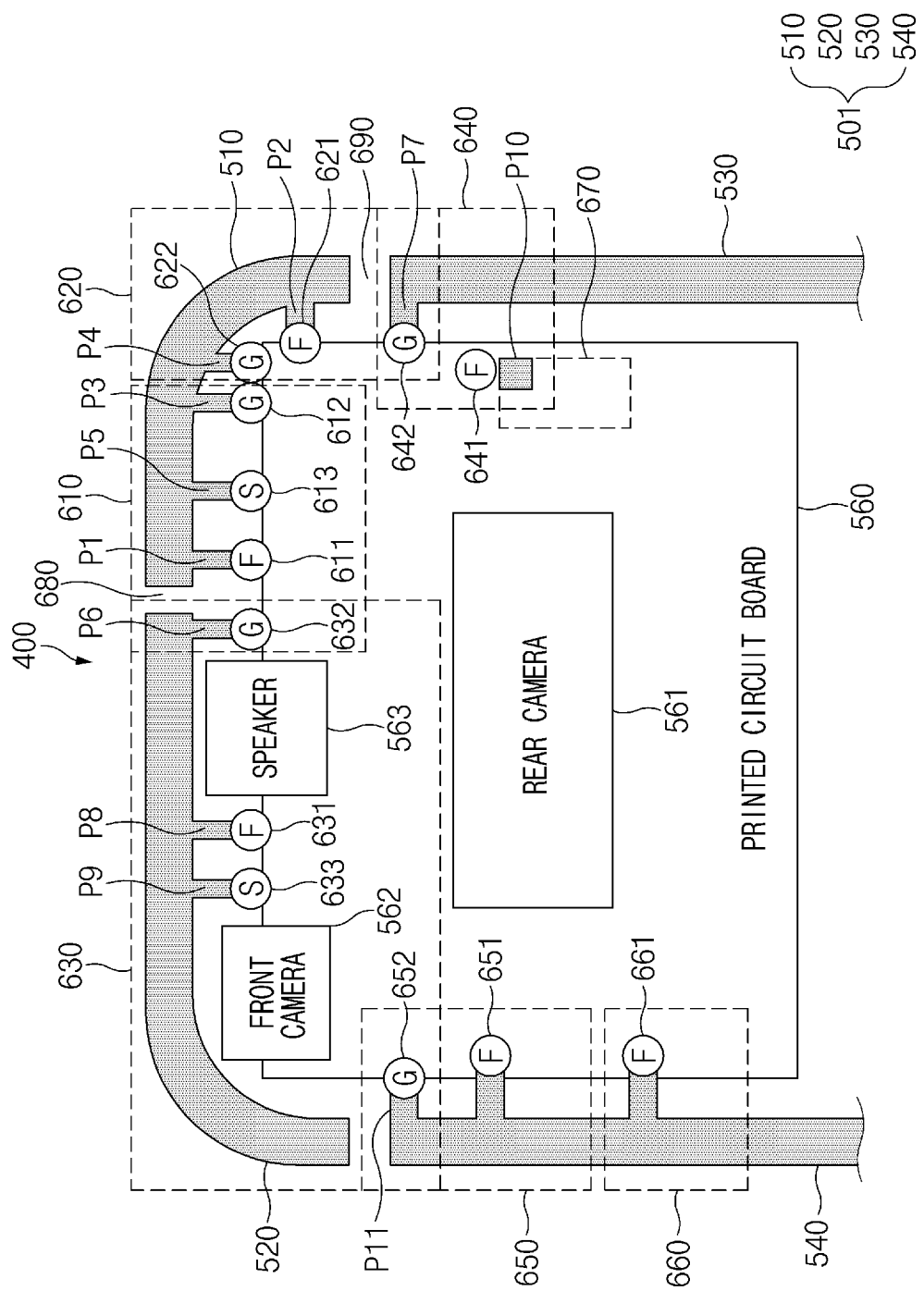
FIG. 4 is a diagram illustrating an antenna structure, according to an embodiment.

FIG. 4 is a diagram 400 illustrating the antenna structure 501, according to an embodiment.

Referring to FIG. 4, the antenna structure 501 may include at least part of the first conductive pattern 510, the second conductive pattern 520, the third conductive pattern 530, the fourth conductive pattern 540, and the fifth conductive pattern 550. The antenna structure 501 may include a first feeding part 611, a second feeding part 621, a first ground part 612, a second ground part 622, a switch 613, and a third ground part 632, and/or a fourth ground part 642.

The first feeding part 611 may be electrically connected to a first location P1 of the first conductive pattern 510. For example, the first location P1 may be a location inside a first portion 610, which is close to the second conductive pattern 520, in the first conductive pattern 510. For example, the first location P1 may be included in a portion of the first conductive pattern 510 more adjacent to the second conductive pattern 520 than the third conductive pattern 530, in the first portion 610. The first feeding part 611 may feed the first conductive pattern 510. The first conductive pattern 510 may receive power from the first feeding part 611 and may transmit and receive signals belonging to at least one frequency band.

The second feeding part 621 may be electrically connected to a second location P2 of the first conductive pattern 510. The second location P2 may be a location closer to the third conductive pattern 530 than the first location. For example, the second location P2 may be a location inside the second portion 620, which is close to the third conductive pattern 530, in the first conductive pattern 510. The second location P2 may be included in a portion of the first conductive pattern 510 more adjacent to the third conductive pattern 530 than the second conductive pattern 520 in the second portion 620. The second feeding part 621 may feed the first conductive pattern 510. The first conductive pattern 510 may receive power from the second feeding part 621 and may transmit and receive signals belonging to at least one frequency band.

The first ground part 612 may be electrically connected to the third location P3 of the first conductive pattern 510. The third location P3 may be a location between the first location P1 and the second location P2 of the first conductive pattern 510. The first ground part 612 may ground the first conductive pattern 510. For example, the first ground part 612 may connect the first portion 610 of the first conductive pattern 510 to the ground layer of the printed circuit board 560. The first conductive pattern 510 connected to the ground layer of the printed circuit board 560 may be grounded.

The second ground part 622 may be electrically connected to the fourth location P4 of the first conductive pattern 510. The fourth location P4 may be a location between the second location P2 and the third location P3 of the first conductive pattern 510. The second ground part 622 may ground the first conductive pattern 510. For example, the second ground part 622 may connect the second portion 620 of the first conductive pattern 510 to the ground layer of the printed circuit board 560. The first conductive pattern 510 connected to the ground layer of the printed circuit board 560 may be grounded.

The switch 613 may be electrically connected to a fifth location P5 of the first conductive pattern 510. The fifth location P5 may be a location between the first location P1 and the third location P3 of the first conductive pattern 510. The switch 613 may be interposed between the first feeding part 611 and the first ground part 612. The switch 613 may change the electrical length of the first portion 610 of the first conductive pattern 510. When the electrical length of the first portion 610 is changed, the resonance frequency of the first conductive pattern 510 may be changed. Accordingly, while the electrical length of the first portion 610 is changed, a frequency band capable of transmitting and receiving signals in the first conductive pattern 510 may be changed.

The third ground part 632 may be electrically connected to a sixth location P6 of the second conductive pattern 520. The sixth location P6 may be a location adjacent to the first conductive pattern 510 in the third portion 630 of the second conductive pattern 520. The third ground part 632 may be included in the first portion 610. The first conductive pattern 510 and the second conductive pattern 520 may be coupled to each other. The first feeding part 611 and the third ground part 632 may transmit and receive signals of a specified frequency.

A fourth ground part 642 may be electrically connected to a seventh location P7 of the third conductive pattern 530. The seventh location P7 may be a location adjacent to the first conductive pattern 510 in the fourth portion 640 of the third conductive pattern 530. The first conductive pattern 510 and the third conductive pattern 530 may be coupled to each other. A resonant frequency may be formed in the second portion 620, which is a part of the first conductive pattern 510 and which is an area where an antenna radiator is implemented, by the capacitance component caused by the coupling. The wireless communication circuit 192 may transmit and receive a signal having a resonant frequency formed in the second portion 620 through the second feeding part 621 and the second portion 620.

The antenna structure 501 may include a third feeding part 631 and/or a switch 633. The third feeding part 631 and/or the switch 633 may be electrically connected to the second conductive pattern 520. The third feeding part 631 may be electrically connected to an eighth location P8 of the second conductive pattern 520. The eighth location P8 may be a location spaced further away from the first conductive pattern 510 than the sixth location P6. The third feeding part 631 may feed the second conductive pattern 520.

The switch 633 may be electrically connected to the ninth location P9 of the second conductive pattern 520. In an embodiment, the ninth location P9 may be a location spaced further away from the sixth location P6 than the eighth location P8. The third portion 630 may include the third feeding part 631, the third ground part 632, a fifth ground part 652, and a partition part between the second conductive pattern 520 and the fourth conductive pattern 540. The switch 633 may change the resonant frequency of the second conductive pattern 520 by adjusting the electrical length of the third portion 630. The switch 633 may selectively adjust the electrical length of the third portion 630 in which the third feeding part 631 includes the capacitance of the partition part between the second conductive pattern 520 and the fourth conductive pattern 540. Accordingly, the second conductive pattern 520 included in the third portion 630 may transmit and receive a signal of a specified frequency.

The antenna structure 501 may include the fourth feeding part 641. The fourth feeding part 641 may be connected to a separate antenna pattern part disposed on the rear cover. The fourth feeding part 641 may be electrically connected to a tenth location P10 of the seventh portion 670. For example, the tenth location P10 may be a location connected to a conductive pattern in the seventh portion 670, which is separate from the first conductive pattern 510 and the third conductive pattern 530. Additionally or alternatively, the fourth feeding part 641 may be connected to the third conductive pattern 530. When the fourth feeding part 641 is connected to a separate antenna pattern part disposed on the rear cover, the fourth feeding part 641 may feed the separate antenna pattern part disposed on the rear cover. When the fourth feeding part 641 is connected to the third conductive pattern 530, the fourth feeding part 641 may feed the third conductive pattern 530.

The antenna structure 501 may further include a first insulating part 680 and/or a second insulating part 690. The first insulating part 680 may be interposed between the first conductive pattern 510 and the second conductive pattern 520. The first insulating part 680 may prevent the first conductive pattern 510 and the second conductive pattern 520 from being shorted with each other. The second insulating part 690 may be interposed between the first conductive pattern 510 and the third conductive pattern 530. The second insulating part 690 may prevent the first conductive pattern 510 and the third conductive pattern 530 from being shorted with each other.

The antenna structure 501 may further include the fourth conductive pattern 540. The fourth conductive pattern 540 may be spaced apart from the second conductive pattern 520. The fourth conductive pattern 540 may be disposed on the opposite side of the third conductive pattern 530 with respect to the printed circuit board 560. A fifth feeding part 651 may be electrically connected to the fifth portion 650 of the fourth conductive pattern 540. A sixth feeding part 661 may be electrically connected to the sixth portion 660 of the fourth conductive pattern 540. A fifth ground part 652 at an eleventh location P11 closer to the second conductive pattern 520 than the fifth feeding part 651 may be electrically connected to the fourth conductive pattern 540. The fourth conductive pattern 540 may receive power from the fifth feeding part 651 and/or sixth feeding part 661 and may transmit and receive a signal of a specified frequency.

Figure 5:
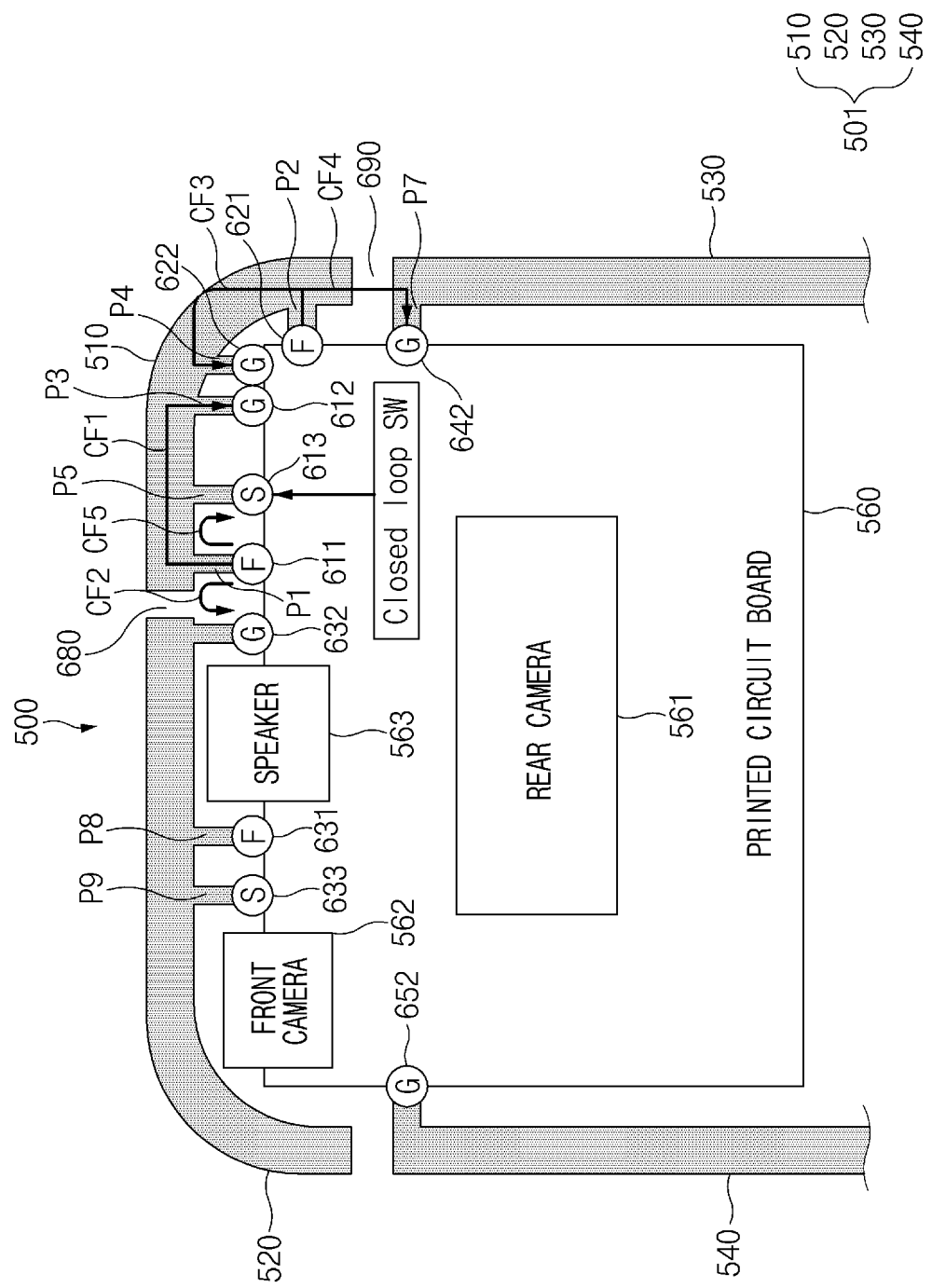
FIG. 5 is a diagram illustrating a current flow of an antenna structure, according to an embodiment.

FIG. 5 is a diagram 500 illustrating current flows of the antenna structure 501, according to an embodiment.

Referring to FIG. 5, the first current flow CF1 may be formed between the first feeding part 611 and the first ground part 612. The first current flow CF1 may be a current flow for transmitting and receiving a signal of a first frequency band. For example, the first frequency band may be a frequency band to which a GPS signal of about 1.575 GHz belongs. When the first ground part 612 is disposed at a location corresponding to a length of ¼ wavelength from the first feeding part 611 in the first conductive pattern 510, a resonant frequency of about 1.575 GHz may occur, and thus GPS resonance may be formed. The second current flow CF2 may be formed between the first feeding part 611 and the third ground part 632. The second current flow CF2 may be a current flow for transmitting and receiving a signal of a second frequency band. The second frequency band may be a different frequency band from the first frequency band. The second frequency band may be a higher frequency band than the first frequency band. For example, the second frequency band may be an IF band and/or a high frequency band (i.e., an MB or an HB) of about 1.8 GHz or more and about 2.7 GHz or less. The resonant frequency of about 1.8 GHz or more and about 2.7 GHz or less may occur due to the coupling between the first conductive pattern 510 and the third conductive pattern 530, which is formed between a partition gap such as the first insulating part 680 formed between the first feeding part 611 and the third ground part 632, and thus a resonance of an IF band and/or a high frequency band (i.e., an MB or an HB) may be formed.

The third current flow CF3 may be formed between the second feeding part 621 and the second ground part 622. The third current flow CF3 may be a current flow for transmitting and receiving a signal of a third frequency band. The third frequency band may be a different frequency band from the first frequency band. The third frequency band may be a frequency band at least partially overlapping with the second frequency band. For example, the third frequency band may be a frequency band to which a Wi-Fi1 signal having a frequency of about 2.4 GHz belongs.

The fourth current flow CF4 may be formed between the second feeding part 621 and the fourth ground part 642. The fourth current flow CF4 may be a current flow for transmitting and receiving a signal of a fourth frequency band. The fourth frequency band may be a different frequency band from the first to third frequency bands. The fourth frequency band may be a frequency band higher than the first frequency band, the second frequency band, and the third frequency band. For example, the fourth frequency band may be a frequency band to which a Wi-Fi2 signal having a frequency of about 5 GHz belongs.

The fifth current flow CF5 may be formed between the first feeding part 611 and the switch 613. The fifth current flow CF5 may be a current flow for transmitting and receiving a signal of the fifth frequency band. The fifth frequency band may be a different frequency band from the first frequency band to the third frequency band. The fifth frequency band may be a frequency band higher than the first frequency band to the third frequency band. The fifth frequency band may be a frequency band at least partially overlapping with the fourth frequency band. For example, the fifth frequency band may be a frequency band to which a 5G NR signal of about 3.3 GHz or more and about 6 GHz or less belongs.

The switch 613 may be a closed loop switch. The switch 613 may be included in a closed loop structure in which the first feeding part 611 and the second feeding part 612 are connected at opposite ends of one metal frame (e.g., the first conductive pattern 510). When the first current flow CF1 and the fifth current flow CF5 are formed by the first feeding part 611, two or more resonant frequencies may be formed in the first feeding part 611. Accordingly, the first conductive pattern 510 may transmit and receive signals belonging to two or more resonant frequencies by the first current flow CF1 and the fifth current flow CF5. The fifth current flow CF5 may pass through elements having reactance values such as capacitance or inductance by the switch 613. The electrical path such as the fifth current flow CF5 may be generated between the switch 613 and the ground layer of the printed circuit board 560. When the reactance value of the switch 613 is changed, the resonant frequency formed by the fifth current flow CF5 may be changed.

The operating principle of the antenna structure 501 included in the electronic device 101 having a metal frame structure may be indicated by using the first to fifth current flows CF1, CF2, CF3, CF4, and CF5. The length between the first feeding part 611 connected to the first location P1 of the first conductive pattern 510 and the first ground part 612 connected to the third location P3 of the first conductive pattern 510 may be about ¼ of the wavelength of the first frequency band including the GPS signal. Accordingly, the resonant frequency within the first frequency band may be formed between the first feeding part 611 and the first ground part 612. The first insulating part 680 interposed between the first conductive pattern 510 and the second conductive pattern 520 may be a partition gap. The resonant frequency within the second frequency band that is MB/HB may be formed between the first feeding part 611 connected to the first location P1 of the first conductive pattern 510 and the third ground part 632 connected to the sixth location P6 of the second conductive pattern 520 by the coupling caused by the capacitance of the partition gap.

The length between the second feeding part 621 connected to the second location P2 of the first conductive pattern 510 and the second ground part 622 connected to the fourth location P4 of the first conductive pattern 510 may be about ¼ of the wavelength of the third frequency band including the Wi-Fi1 signal. Accordingly, the resonant frequency within the third frequency band may be formed between the second feeding part 621 and the second ground part 622. The second insulating part 690 interposed between the first conductive pattern 510 and the third conductive pattern 530 may be a partition gap. A resonant frequency within the fourth frequency band including the Wi-Fi2 signal may be formed between the second feeding part 621 connected to the second location P2 of the first conductive pattern 510 and the fourth ground part 642 connected to the seventh location P7 of the third conductive pattern 530 by coupling caused by the capacitance of the partition gap.

In the antenna structure 501 including the first conductive pattern 510, a switch and a grounding structure may be implemented in a single metal frame. For example, the first ground part 612 and the second ground part 622 may be disposed at the third location P3 and the fourth location P4 of the first conductive pattern 510, respectively. Accordingly, the isolation between the first portion 610 and the second portion 620 of the first conductive pattern 510 may be secured. Additionally, the fifth current flow CF5 may be capable of transmitting and receiving signals in a fifth frequency band by arranging a switch 613 between the first feeding part 611 and the first ground part 612. Accordingly, the antenna structure 501 including the first conductive pattern 510 may additionally support a 5G NR frequency band of about 3.3 GHz or more and about 6 GHz or less.

Figure 6:
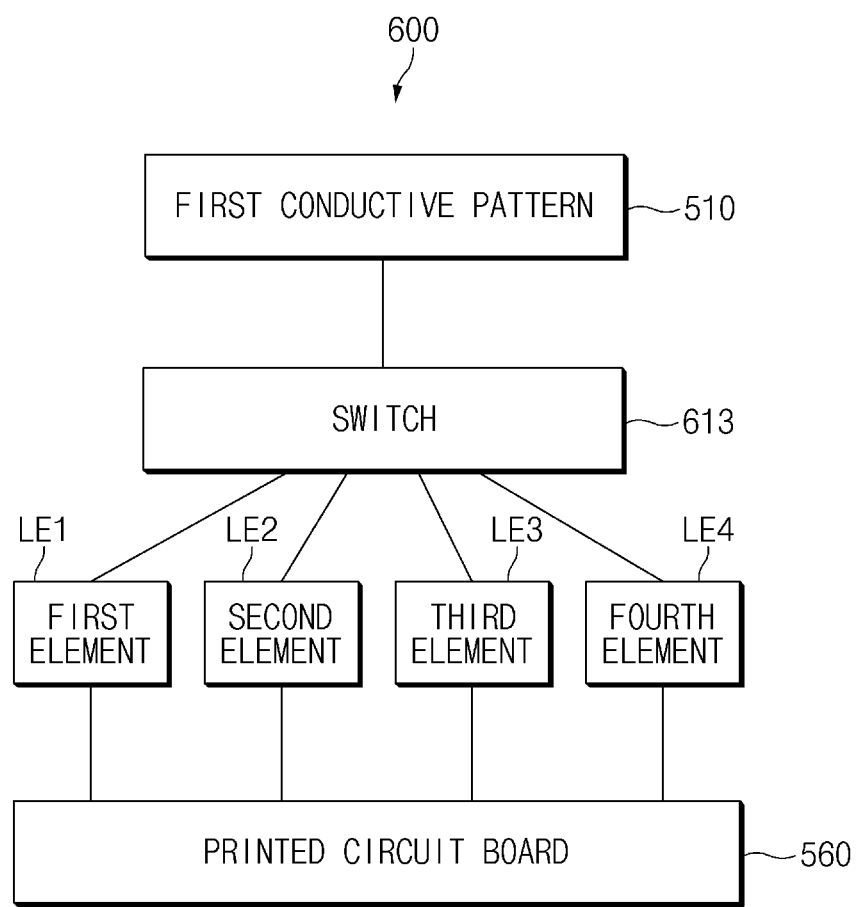
FIG. 6 is a diagram illustrating details of a switch, according to an embodiment.

FIG. 6 is a diagram 600 illustrating a switch 613, according to an embodiment.

Referring to FIG. 6, the first conductive pattern 510 may be a partial area of the metal housing.

The switch 613 may be connected to the first conductive pattern 510. The switch 613 may be selectively connected to at least one lumped element (LE). For example, the switch 613 may be selectively connected to at least one of the first element LE1, the second element LE2, the third element LE3, and the fourth element LE4. The first element LE1, the second element LE2, the third element LE3, and the fourth element LE4 may include any one of a resistor, an inductor, and/or a capacitor. The switch 613 may include a switch and at least one or more LEs. In addition, the switch 613 may include a switch and an element other than LEs. The switch 613 may be an adjustable portion or a tunable unit. The switch 613 may be connected to the ground layer of the printed circuit board 560 through the first element LE1, the second element LE2, the third element LE3, and the fourth element LE4. The switch 613 may receive a control signal from a processor 120 and may control an electrical path between the first conductive pattern 510 and the printed circuit board 560. For example, the switch 613 may change the impedance between the first conductive pattern 510 and the printed circuit board 560, based on the control signal.

The first element LE1, the second element LE2, the third element LE3, and the fourth element LE4 may connect the switch 613 and the ground layer of the printed circuit board 560. The first element LE1, the second element LE2, the third element LE3, and the fourth element LE4 may include inductors. The first element LE1 may have a first inductance. For example, the first element LE1 may have an inductance of 10 nanohenry (nH) or more and 20 nH or less (e.g., about 15 nH). The second element LE2 may have a second inductance greater than the first inductance. For example, the second element LE2 may have an inductance of 28 nH or more and 38 nH or less (e.g., about 33 nH). The third element LE3 may have a third inductance greater than the second inductance. For example, the third element LE3 may have an inductance of 42 nH or more and 52 nH or less (e.g., about 47 nH). The fourth element LE4 may have a fourth inductance greater than the third inductance. For example, the fourth element LE4 may have an inductance of 50 nH or more and 60 nH or less (e.g., about 56 nH).

The switch 613 and the ground layer of the printed circuit board 560 may not be connected to the first element LE1, the second element LE2, the third element LE3, and the fourth element LE4, or may be selectively connected to at least one of the first element LE1, the second element LE2, the third element LE3, and the fourth element LE4. The inductance between the switch 613 and the ground layer of the printed circuit board 560 may vary. The electrical length between the first feeding part 611 and the ground may be changed. Accordingly, the resonant frequency band by the fifth current flow CF5 formed between the first feeding part 611 and the ground may be selectively changed.

Figure 7:
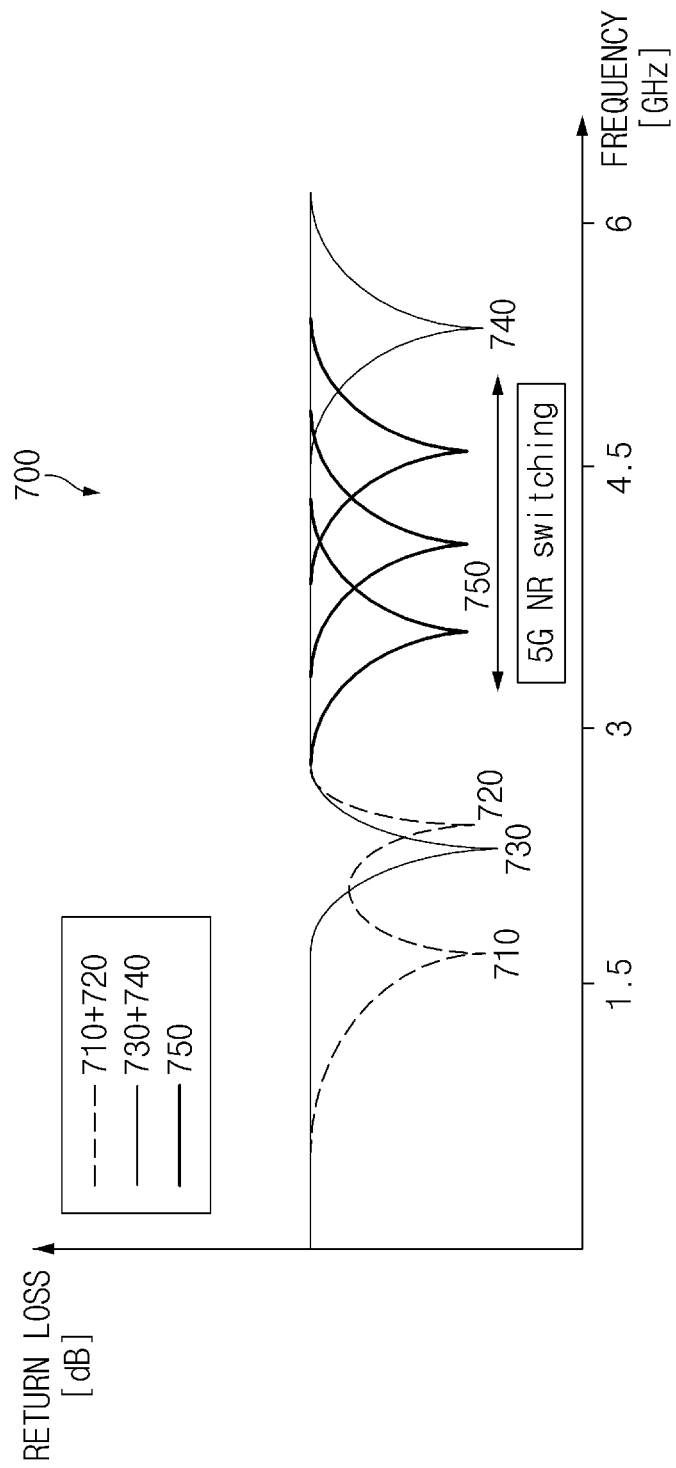
FIG. 7 is a diagram illustrating frequency bands, to which signals transmitted and received by an antenna structure belong, according to an embodiment.

FIG. 7 is a diagram 700 illustrating frequency bands, to which signals transmitted and received by an antenna structure 501 belong, according to an embodiment.

Referring to FIG. 7, a first signal 710 may be a signal transmitted and received by a first current flow CF1. For example, the first signal 710 may be a GPS signal. A second signal 720 may be a signal transmitted and received by a second current flow CF2. For example, the second signal 720 may be a signal belonging to MB/HB. A third signal 730 may be a signal transmitted and received by a third current flow CF3. For example, the third signal 730 may be a Wi-Fi1 signal. A fourth signal 740 may be a signal transmitted and received by a fourth current flow CF4. For example, the fourth signal 740 may be a Wi-Fi2 signal. A fifth signal 750 may be a signal transmitted and received by the fifth current flow CF5. For example, the fifth signal 750 may be a 5G NR signal.

The first signal 710 may have a first frequency band; the second signal 720 may have a second frequency band; the third signal 730 may have a third frequency band; the fourth signal 740 may have a fourth frequency band; and/or the fifth signal 750 may have a fifth frequency band. The first signal 710, the second signal 720, the third signal 730, the fourth signal 740 and the fifth signal 750 may form a resonant frequency band while a return loss decreases in the corresponding frequency band. For example, the first signal 710 may have the reduced return loss in the first frequency band. The first frequency band may be about 1.565 GHz. In another example, the second signal 720 may have the reduced return loss in the second frequency band. The second frequency band may be about 2.7 GHz. Additionally, the third signal 730 may have the reduced return loss in the third frequency band. The third frequency band may be about 2.4 GHz. In addition, the fourth signal 740 may have the reduced return loss in the fourth frequency band. The fourth frequency band may be about 5 GHz. Additionally, the fifth signal 750 may have the reduced return loss in the fifth frequency band. The fifth frequency band may be about 3.3 GHz or more and about 6 GHz or less.

The fifth frequency band may vary. When the electrical length formed by the first element LE1, the second element LE2, the third element LE3, and the fourth element LE4 inside the switch 613 is changed, the frequency band where resonance occurs may be changed.

A first resonant frequency including the first signal 710 may be formed by the first current flow CF1. A second resonant frequency including the second signal 720 may be formed by the second current flow CF2.

The fifth current flow CF5 may occur depending on the inductance of one of the first element LE1, the second element LE2, the third element LE3, and the fourth element LE4 connected to the switch 613. Accordingly, when the fifth resonant frequency being a new resonant frequency including the fifth signal 750 is formed and the inductance is changed, the frequency of the fifth resonance frequency may be changed. For example, when the inductance is increased from about 33 nH to about 56 nH at the switch 613, the fifth resonant frequency may be reduced. Accordingly, 5G NR switching may occur. As such, the broadband antenna structure 501 supporting a frequency band of about 1.5 GHz or more and about 6 GHz or less may be implemented by applying a switch in a closed loop structure.

Figure 8:
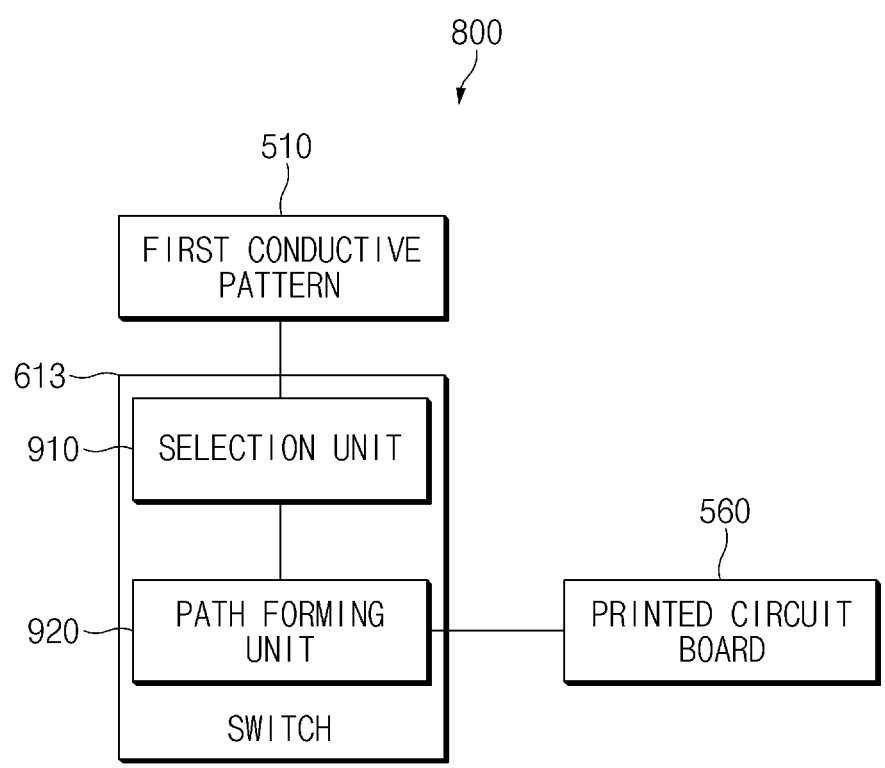
FIG. 8 is a block diagram illustrating a first conductive pattern, a switch, and a printed circuit board of an electronic device, according to an embodiment.

FIG. 8 is a block diagram 800 illustrating the first conductive pattern 510, the switch 613, and the printed circuit board 560 of an electronic device 101, according to an embodiment.

Referring to FIG. 8, the switch 613 may include a selection unit 910 and a path forming unit 920. The selection unit 910 may include a switching element. A plurality of LEs (e.g., the first element LE1, the second element LE2, the third element LE3, and the fourth element LE4) may be disposed on the path forming unit 920 in parallel. The first element LE1, the second element LE2, the third element LE3, and the fourth element LE4 may have different impedances from one another. For example, a plurality of parallel paths in which the first element LE1, the second element LE2, the third element LE3, and the fourth element LE4 are disposed may have different impedances from one another, by including an inductor or a capacitor. Additionally or alternatively, some of the plurality of parallel paths in which the p1 first element LE1, the second element LE2, the third element LE3, and the fourth element LE4 are disposed may have the same impedance as one another. At least one of the plurality of parallel paths in which the first element LE1, the second element LE2, the third element LE3, and the fourth element LE4 are arranged may be electrically connected to the printed circuit board 560.

The switching element may connect the first conductive pattern 510 to one of the plurality of parallel paths in which the first element LE1, the second element LE2, the third element LE3, and the fourth element LE4 are arranged. The switch 613 may connect the first conductive pattern 510 to the printed circuit board 560, using one of the plurality of parallel paths in which the first element LE1, the second element LE2, the third element LE3, and the fourth element LE4 are arranged. The switch 613 may change the impedance between the first conductive pattern 510 and the printed circuit board 560.

When the impedance between the first conductive pattern 510 and the printed circuit board 560 is changed, the fifth current flow CF5 formed between the first feeding part 611 and the switch 613 may be changed. When the fifth current flow CF5 is changed, the fifth resonant frequency band may be changed. Accordingly, the switch 613 may implement 5G NR switching.

Figure 9:
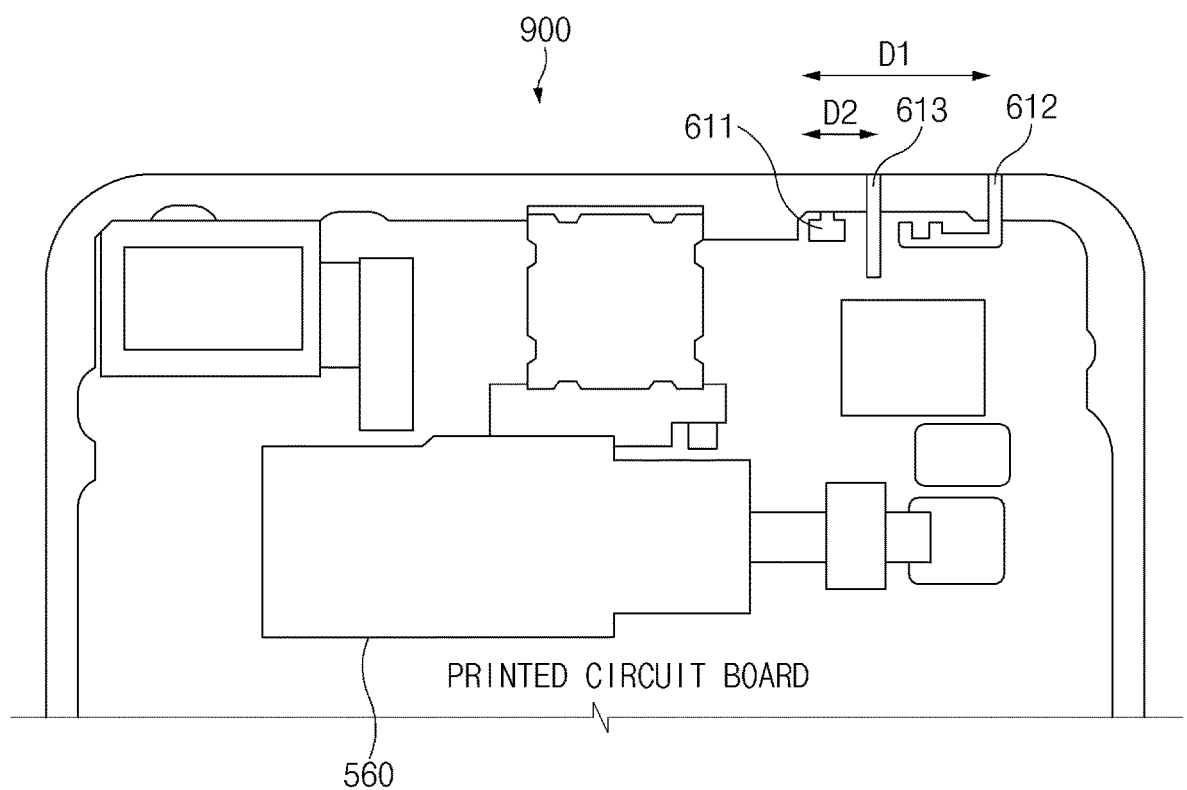
FIG. 9 is a diagram illustrating a first feeding part, a first ground part, and a switch of an electronic device, according to an embodiment.

FIG. 9 is a diagram 900 illustrating the first feeding part 611, the first ground part 612, and the switch 613 of an electronic device 101, according to an embodiment.

Referring to FIG. 9, a distance between the first feeding part 611 and the first ground part 612 may be a first distance D1. A distance between the first feeding part 611 and the switch 613 may be a second distance D2. The second distance D2 may be shorter than the first distance D1.

The fifth frequency band may be set by setting the distance between the first feeding part 611 electrically connected to the first conductive pattern 510 and the switch 613. As an electric field (E-field) of the first conductive pattern 510 is higher, the switch 613 may be operated based on the voltage difference. Accordingly, the switch 613 may be disposed adjacent to a location where the electric field of the first conductive pattern 510 is high.

In the case of a low frequency band, the electric field of the first conductive pattern 510 may increase as the distance from the first feeding part 611 increases. The first distance D1, which forms the first current flow for transmitting and receiving a signal in of a low frequency band and which is between the first feeding part 611 and the first ground part 612, may be increased in the first conductive pattern 510. For example, the first distance D1 may be about 11 millimeter (mm).

In the case of a high frequency band, when the distance from the first feeding part 611 is about 0.1 times the wavelength of a signal belonging to the high frequency band, the electric field of the first conductive pattern 510 may have the greatest magnitude. Accordingly, the distance, which forms the fifth current flow for transmitting and receiving signals in a high frequency band in the first conductive pattern 510 and which is between the first feeding part 611 and the switch 613, may be set to about 0.1 times the wavelength of the signal belonging to the high frequency band. For example, the second distance D2 may be about 3 mm.

Figure 10:
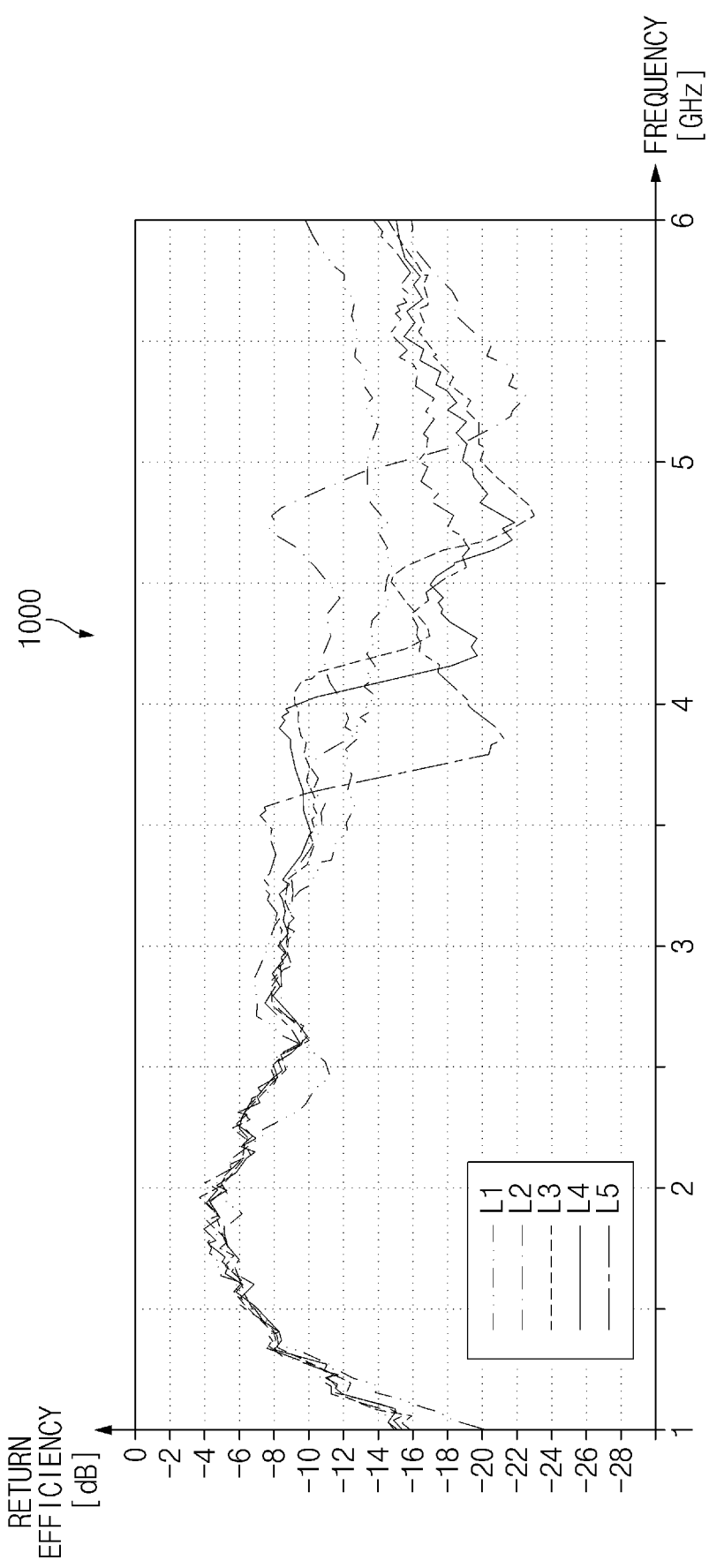
FIG. 10 is a diagram illustrating a resonant frequency according to an inductance of a switch of an antenna structure, according to an embodiment.

FIG. 10 is a diagram 1000 illustrating a resonant frequency, according to an inductance of a switch 613 of an antenna structure 501, according to an embodiment.

Referring to FIG. 10, it is possible to change impedance, using the switch 613 of the antenna structure 501 and elements (e.g., the first element LE1, the second element LE2, the third element LE3, and the fourth element LE4). The first inductor L1 indicates that the impedance is set by selecting an element such that the impedance matches the first inductor L1 by controlling the switch 613 to have an inductance of about 1 nH. The second inductor L2 refers to the antenna structure 501 to which the switch 613 for setting the impedance is applied by selecting an element such that the impedance matches the second inductor L2 by controlling the switch 613 to have an inductance of about 15 nH. The third inductor L3 indicates that the impedance is set by selecting an element such that the impedance matches the third inductor L3 by controlling the switch 613 to have an inductance of about 33 nH. The fourth inductor L4 indicates that the impedance is set by selecting an element such that the impedance matches the fourth inductor L4 by controlling the switch 613 to have an inductance of about 47 nH. The fifth inductor L5 indicates that the switch 613 is set to have an inductance of about 56 nH.

When the inductance is changed by controlling the switch 613 to select an element, the resonant frequency of the antenna structure 501 may be changed. At the resonant frequency, the return efficiency may be reduced to about −10 dB or less. The return efficiency of the antenna structure 501 may be about −12 dB or more and about −4 dB or less in a frequency band of about 1.5 GHz or more and about 3.5 GHz or less, regardless of the first inductor L1, the second inductor L2, the third inductor L3, the fourth inductor L4, and the fifth inductor L5. Accordingly, it may be seen that the return efficiency satisfies the specified performance even when one of the first inductor L1, the second inductor L2, the third inductor L3, the fourth inductor L4, and the fifth inductor L5 is used in the low frequency band of about 1.5 GHz or more and about 3.5 GHz or less.

The return efficiency in the frequency band of about 3.5 GHz or more and about 6 GHz or less in the antenna structure 501 at a point in time when the first inductor L1 is used may be higher than the return efficiency in the high frequency band of the antenna structure 501 at a point in time when the fifth inductor L5 is used. For example, the return efficiency in the frequency band of about 3.5 GHz or more and about 6 GHz or less at a point in time when the first inductor L1 is used may be about −10 dB. On the other hand, the return efficiency in the frequency band of about 3.5 GHz or more and about 6 GHz or less at a point in time when the fifth inductor L5 is used may be about −20 dB or more and about −10 dB. Accordingly, the resonant frequency may be decreased as the inductance of each of the first inductor L1, the second inductor L2, the third inductor L3, the fourth inductor L4, and the fifth inductor L5 connected to the switch 613 is increased.

Figure 11:
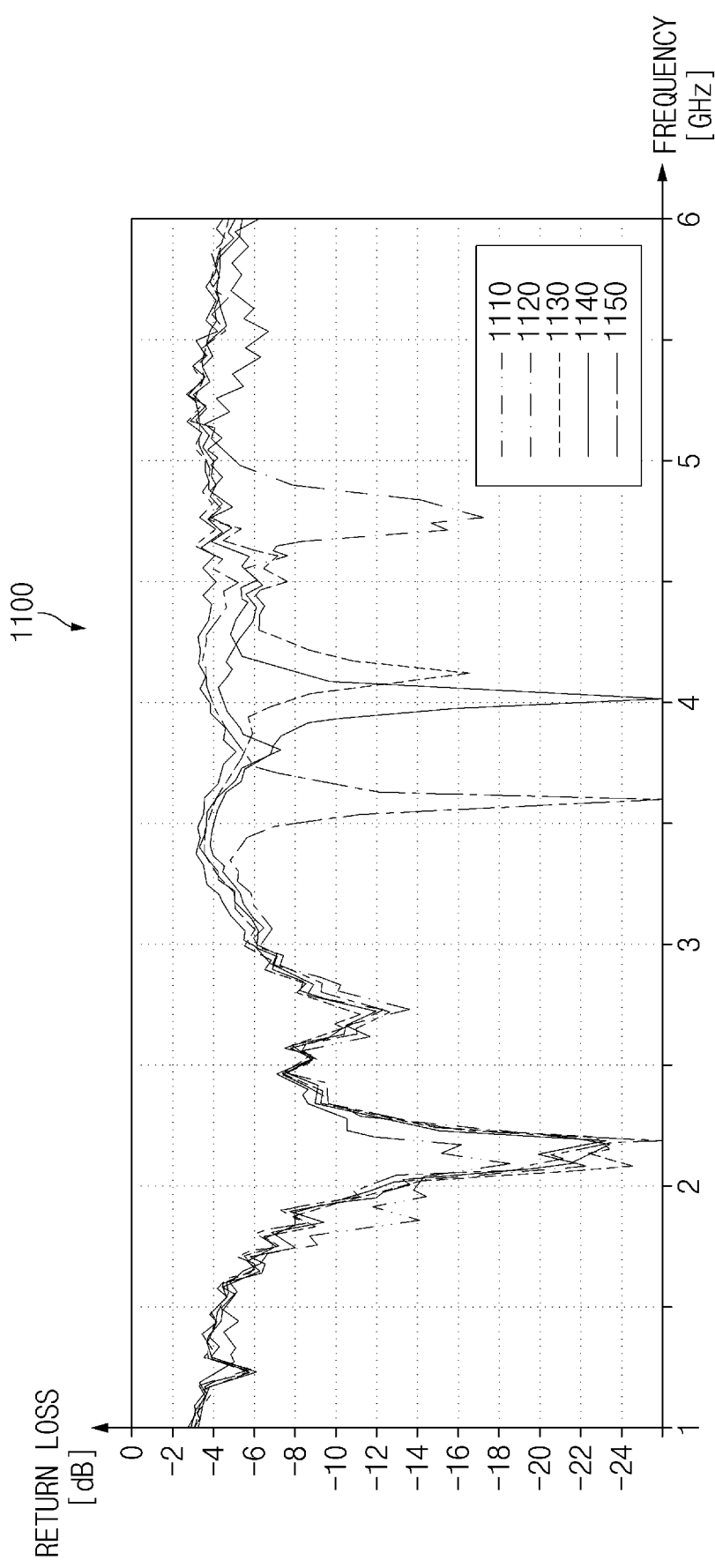
FIG. 11 is a diagram illustrating a return loss according to a frequency of an antenna structure, according to an embodiment.

FIG. 11 is a diagram 1100 illustrating a return loss according to a frequency of the antenna structure 501, according to an embodiment.

Referring to FIG. 11, each of the first antenna structure 1110, the second antenna structure 1120, the third antenna structure 1130, the fourth antenna structure 1140, and the fifth antenna structure 1150 in FIG. 11 may be substantially the same as the antenna structure 501 connected to the first inductor L1, the second inductor L2, the third inductor L3, the fourth inductor L4, and the fifth inductor L5 in FIG. 10.

The first antenna structure 1110, the second antenna structure 1120, the third antenna structure 1130, the fourth antenna structure 1140, and the fifth antenna structure 1150 may respectively have specified return losses depending on frequencies. The first antenna structure 1110, the second antenna structure 1120, the third antenna structure 1130, the fourth antenna structure 1140, and the fifth antenna structure 1150 may have minimum return losses in which reflection is minimized while resonance occurs in a specific frequency band. The first antenna structure 1110 may have the minimum return loss at about 2 GHz. The second antenna structure 1120 may have the minimum return loss at about 5 GHz. The third antenna structure 1130 may have the minimum return loss at about 4.2 GHz. The fourth antenna structure 1140 may have the minimum return loss at about 4 GHz. The fifth antenna structure 1150 may have the minimum return loss at about 3.5 GHz.

Compared with the first antenna structure 1110, the second antenna structure 1120, the third antenna structure 1130, the fourth antenna structure 1140, and the fifth antenna structure 1150, the 5G NR band may be implemented when the switch 613 is applied. Furthermore, referring to return losses in the low frequency band, the middle frequency band, and the high frequency band of the second antenna structure 1120, the third antenna structure 1130, the fourth antenna structure 1140, and the fifth antenna structure 1150, it may be seen that the performance is maintained substantially equally in the low frequency band and the middle frequency band, even though the switch 613 is applied.

Figure 12:
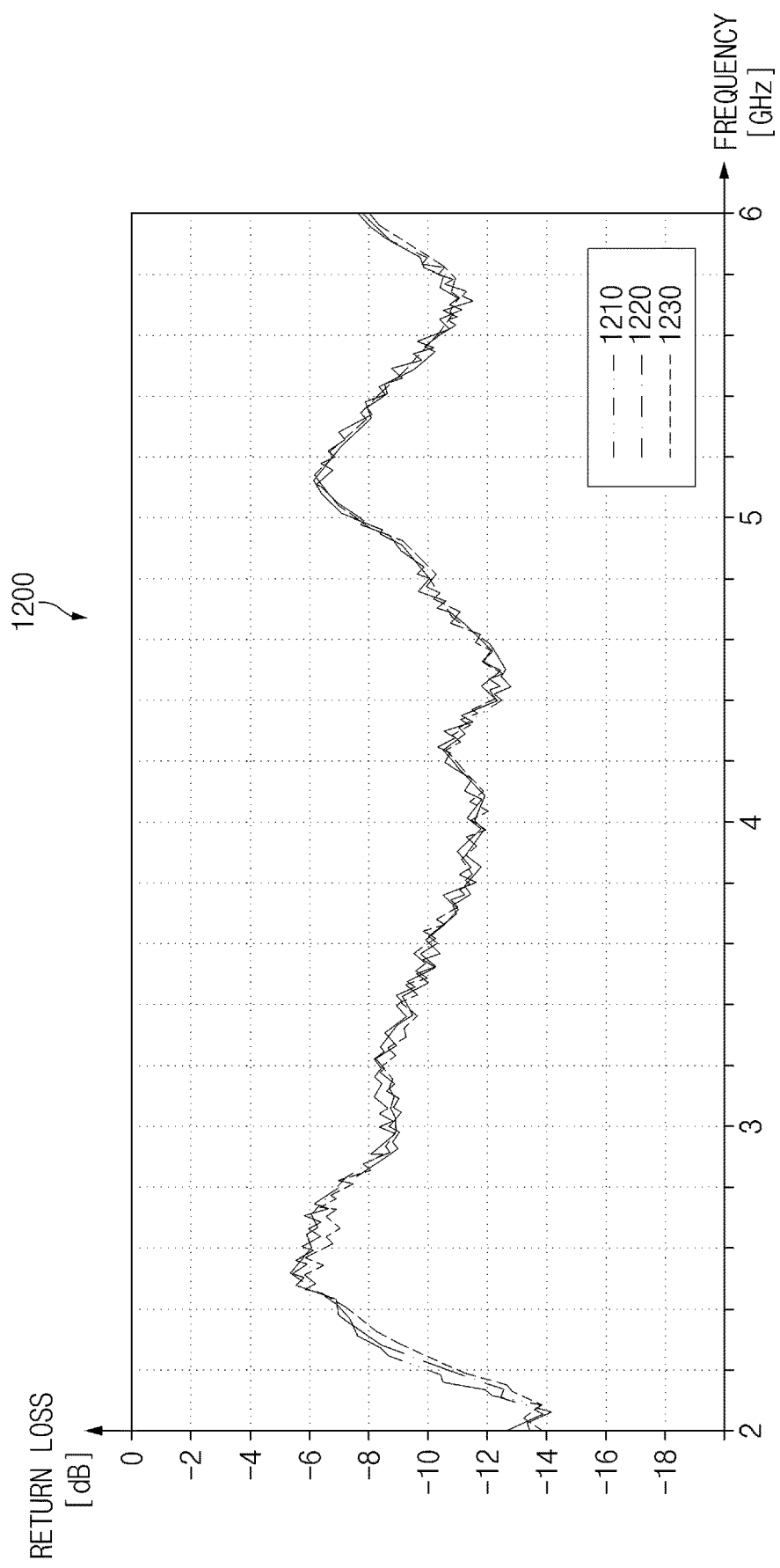
FIG. 12 is a diagram illustrating a return loss in a frequency band including a Wi-Fi signal of an antenna structure, according to an embodiment.

FIG. 12 is a diagram 1200 illustrating a return loss in a frequency band including a Wi-Fi signal of the antenna structure 501, according to an embodiment.

Referring to FIG. 12, the first antenna structure 1210, the second antenna structure 1220, and the third antenna structure 1230 may be substantially the same as the first antenna structure 1110, the second antenna structure 1120, and the third antenna structure 1130 of FIG. 11.

The first antenna structure 1210, the second antenna structure 1220, and the third antenna structure 1230 may respectively return losses based on frequencies. The return losses of the first to third antenna structures 1210, 1220, and 1230 may be maintained substantially equally in the third and fourth frequency bands (e.g., the third and fourth frequency bands including the third signal 730 and the fourth signal 740 in FIG. 7), including Wi-Fi signals. When signals in different frequency bands are radiated by using the first conductive pattern 510, the isolation between the first portion 610 and the second portion 620 may be ensured by the first ground part 612 and the second ground part 622. Accordingly, the third and fourth frequency bands including the third signal 730 and the fourth signal 740, including the Wi-Fi signal, may maintain substantially the same performance regardless of the impedance of a switch 613.

An electronic device 101 may include a housing including a front plate, a rear plate facing away from the front plate, and a side member surrounding a space between the front plate and the rear plate and connecting one side of the front plate to one side of the rear plate, an antenna structure 501 including at least part of the first conductive pattern 510, the second conductive pattern 520, the third conductive pattern 530, the fourth conductive pattern 540, and the fifth conductive pattern 550, and a printed circuit board 560 disposed in the space and including at least one processor 120. At least part of the side member may be conductive portions (e.g., the first conductive pattern 510, the second conductive pattern 520, the third conductive pattern 530, the fourth conductive pattern 540, and the fifth conductive pattern 550 of FIG. 3). The second conductive pattern 520 may be disposed to be at least partially coupled to the first conductive pattern 510, and a third conductive pattern 530 may be disposed to be at least partially coupled to the first conductive pattern 510 and to be spaced apart from the second conductive pattern 520. The antenna structure 501 may include a first feeding part 611 electrically connected to a first location P1 of the first conductive pattern 510, a second feeding part 621 electrically connected to a second location P2 of the first conductive pattern 510 closer to the third conductive pattern 530 than the first location P1, a first ground part 612 electrically connected to a third location P3 between the first location P1 and the second location P2 of the first conductive pattern 510, a second ground part 622 electrically connected to a fourth location P4 between the second location P2 and the third location P3 of the first conductive pattern 510, a switch 613 electrically connected to a fifth location P5 between the first location P1 and the third location P3 of the first conductive pattern 510, a third ground part 632 electrically connected to a sixth location P6 of the second conductive pattern 520, and a fourth ground part 642 electrically connected to a seventh location P7 of the third conductive pattern 530.

A first current flow CF1 for transmitting and receiving a signal in a first frequency band may be formed between the first feeding part 611 and the first ground part 612, and a second current flow CF2 for transmitting and receiving a signal in a second frequency band being a frequency band higher than the first frequency band may be formed between the first feeding part 611 and the third ground part 632.

The third current flow CF3 for transmitting and receiving a signal in a third frequency band being a frequency band between the first frequency band and the second frequency band may be formed between the second feeding part 621 and the second ground part 622. The fourth current flow CF4 for transmitting and receiving a signal in a fourth frequency band being a frequency band higher than the second frequency band may be formed between the second feeding part 621 and the fourth ground part 642.

The fifth current flow CF5 for transmitting and receiving a signal in a fifth frequency band being a frequency band between the second frequency band and the fourth frequency band may be formed between the first feeding part 611 and the switch 613.

The antenna structure 501 may further include the third feeding part 631 electrically connected to the eighth location P8 of the second conductive pattern 520 spaced further apart from the first conductive pattern 510 than the sixth location P6, and the switch 633 electrically connected to the ninth location P9 of the second conductive pattern 520 spaced further apart from the first conductive pattern 510 than the eighth location P8.

The antenna structure 501 may further include the fourth feeding part 641 electrically connected to the tenth location P10 of the third conductive pattern 530 spaced further apart from the first conductive pattern 510 than the seventh location P7.

The antenna structure 501 may further include the first insulating part 680 interposed between the first conductive pattern 510 and the second conductive pattern 520, and the second insulating part 690 between the first conductive pattern 510 and the third conductive pattern 530.

The fourth conductive pattern 540 may be spaced apart from the second conductive pattern 520 and disposed on an opposite side of the third conductive pattern 530 with respect to the printed circuit board 560.

The electronic device 101 may include the first conductive pattern 510, the second conductive pattern 520, the third conductive pattern 530, the fourth conductive pattern 540, and the fifth conductive pattern 550, and an antenna structure 501 including at least part of the first conductive pattern 510, the second conductive pattern 520, the third conductive pattern 530, the fourth conductive pattern 540, and the fifth conductive pattern 550. The second conductive pattern 520 may be disposed to be at least partially coupled to the first conductive pattern 510, and a third conductive pattern 530 may be disposed to be at least partially coupled to the first conductive pattern 510 and to be spaced apart from the second conductive pattern 520. The antenna structure 501 may include a first feeding part 611 connected to a portion adjacent to the second conductive pattern 520, in the first conductive pattern 510, a second feeding part 621 connected to a portion adjacent to the third conductive pattern 530, in the first conductive pattern 510, the first ground part 612 and/or second ground part 622 connected to a portion between the first feeding part 611 and the second feeding part 621 of the first conductive pattern 510, and a switch 613 electrically connected to a portion between the first feeding part 611 and the first ground part 612 and/or second ground part 622 of the first conductive pattern 610. A frequency band, to which a signal transmitted and received by the first feeding part 611 and the switch 613 belongs, may be a higher frequency band than a frequency band to which a signal transmitted and received by the first feeding part 611 and the first ground part 612 and/or second ground part 622 belongs.

The first ground part 612 may be close to the first feeding part 611, and the second ground part 622 may be close to the second feeding part 621. The first current flow CF1 for transmitting and receiving a signal in a frequency band of 1.4 GHz or more and 1.7 GHz or less may be formed between the first feeding part 611 and the first ground part 612, and the third current flow CF3 for transmitting and receiving a signal having a frequency of 2.3 GHz or more and 2.5 GHz or less may be formed between the second feeding part 621 and the second ground part 622.

The antenna structure 501 may further include the third ground part 632 connected to a portion adjacent to the first conductive pattern 510, in the second conductive pattern 520. The second current flow CF2 for transmitting and receiving a signal belonging to a frequency band of 1.8 GHz or more and 2.7 GHz or less may be formed between the first feeding part 611 and the third ground part 632.

The antenna structure 501 may further include the fourth ground part 642 connected to a portion adjacent to the first conductive pattern 510, in the third conductive pattern 530. The fourth current flow CF4 for transmitting and receiving a signal of 4 GHz or more and 6 GHz or less may be formed between the second feeding part 621 and the fourth ground part 642.

A frequency band to which a signal transmitted and received by the first feeding part 611 and the switch 613 belongs may be greater than or equal to 3 GHz and less than or equal to 7 GHz.

A distance between the first feeding part 611 and the first ground part 612 or second grand part 622 may be ¼ times a wavelength of a signal transmitted and received by a current flow between the first feeding part 611 and the first ground part 612 or second grand part 622.

A distance between the first feeding part 611 and the switch 613 may be 0.1 times a wavelength of a signal transmitted and received by a current flow between the first feeding part 611 and the first ground part 612 or second grand part 622.

According to various embodiments, the electronic device may include a housing including a front plate, a rear plate facing away from the front plate, and a side member surrounding a space between the front plate and the rear plate and connecting one side of the front plate to one side of the rear plate, an antenna structure including at least part of the first conductive pattern, the second conductive pattern, the third conductive pattern, the fourth conductive pattern, and the fifth conductive pattern, and a printed circuit board disposed in the space and including at least one processor. At least part of the side member may be the first conductive pattern, the second conductive pattern, the third conductive pattern, the fourth conductive pattern, and the fifth conductive pattern. The second conductive pattern may be disposed to be at least partially coupled to the first conductive pattern, and the third conductive pattern may be disposed to be at least partially coupled to the first conductive pattern and to be spaced apart from the second conductive pattern. The antenna structure may include a first feeding part electrically connected to a first location of the first conductive pattern, a second feeding part electrically connected to a second location of the first conductive pattern closer to the third conductive pattern than the first location, a first ground part electrically connected to a third location between the first location and the second location of the first conductive pattern, a second ground part electrically connected to a fourth location between the second location and the third location of the first conductive pattern, and a switch electrically connected to a fifth location between the first location and the third location of the first conductive pattern. The first feeding part may transmit and receive a signal in a first frequency band with the first ground part by forming a first current flow. The second feeding part may transmit and receive a signal in a third frequency band different from the first frequency band with the second ground part by forming a third current flow. The first feeding part may transmit and receive a signal in a fifth frequency band different from the first frequency band and the third frequency band with the switch by forming a fifth current flow.

The antenna structure may further include a third ground part electrically connected to a sixth location of the second conductive pattern. A second current flow for transmitting and receiving a signal in a second frequency band different from the first frequency band may be formed between the first feeding part and the third ground part.

The antenna structure may further include a third feeding part electrically connected to an eighth location of the second conductive pattern more spaced further apart from the first conductive pattern than the sixth location, and a switch electrically connected to a ninth location P9 of the second conductive pattern spaced further apart from the first conductive pattern than the eighth location.

The antenna structure 501 may further include a fourth ground part electrically connected to a seventh location of the third conductive pattern. A fourth current flow for transmitting and receiving a signal in a fourth frequency band different from the third frequency band may be formed between the second feeding part and the fourth ground part.

The antenna structure may further include a fourth feeding part electrically connected to a tenth location of the third conductive pattern spaced further apart from the first conductive pattern than the seventh location.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments, an electronic device may reduce the space occupied by the antenna structure because no additional conductive pattern is disposed on the antenna structure because an antenna structure with a closed loop type switching scheme is applied. Additionally, the electronic device may transmit or receive signals in high frequency bands.

According to various embodiments, the electronic device may transmit or receive signals belonging to various frequency bands, by securing an isolation area between a portion transmitting and receiving a signal in a low frequency band and a portion transmitting and receiving a signal in a high frequency band in the antenna structure.

While the disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:
1. An electronic device comprising:
 a housing including a front plate, a rear plate facing away from the front plate, and a side member surrounding a space between the front plate and the rear plate and connecting one side of the front plate to one side of the rear plate, wherein at least part of the side member is a conductive portion;
 an antenna structure including at least part of the conductive portion; and
 a printed circuit board disposed in the space and including at least one processor,
 wherein the conductive portion includes:
  a first conductive pattern;
  a second conductive pattern disposed at least partially coupled to the first conductive pattern; and
  a third conductive pattern disposed at least partially coupled to the first conductive pattern and spaced apart from the second conductive pattern,
 wherein the antenna structure includes:
  a first feeding part electrically connected to a first location of the first conductive pattern;
  a second feeding part electrically connected to a second location of the first conductive pattern, wherein the second location is closer to the third conductive pattern than the first location;
  a first ground part electrically connected to a third location between the first location and the second location of the first conductive pattern;
  a second ground part electrically connected to a fourth location between the second location and the third location of the first conductive pattern;

a switch electrically connected to a fifth location between the first location and the third location of the first conductive pattern;

a third ground part electrically connected to a sixth location of the second conductive pattern; and a fourth ground part electrically connected to a seventh location of the third conductive pattern.

2. The electronic device of claim 1, wherein a first current flow for transmitting and receiving a first signal in a first frequency band is formed between the first feeding part and the first ground part, and wherein a second current flow for transmitting and receiving a second signal in a second frequency band that is higher than the first frequency band is formed between the first feeding part and the third ground part.

3. The electronic device of claim 2, wherein a third current flow for transmitting and receiving a third signal in a third frequency band that is between the first frequency band and the second frequency band is formed between the second feeding part and the second ground part, and wherein a fourth current flow for transmitting and receiving a fourth signal in a fourth frequency band that is higher than the second frequency band is formed between the second feeding part and the fourth ground part.

4. The electronic device of claim 3, wherein a fifth current flow for transmitting and receiving a fifth signal in a fifth frequency band that is between the second frequency band and the fourth frequency band is formed between the first feeding part and the switch.

5. The electronic device of claim 1, wherein the antenna structure further includes:

a third feeding part electrically connected to an eighth location of the second conductive pattern more spaced apart from the first conductive pattern than the sixth location; and another switch electrically connected to a ninth location of the second conductive pattern that is spaced further apart from the first conductive pattern than the eighth location.

6. The electronic device of claim 1, wherein the antenna structure further includes:

a fourth feeding part electrically connected to an eighth location of the third conductive pattern spaced further apart from the first conductive pattern than the seventh location.

7. The electronic device of claim 1, wherein the antenna structure further includes:

a first insulating part interposed between the first conductive pattern and the second conductive pattern; and a second insulating part between the first conductive pattern and the third conductive pattern.

8. The electronic device of claim 1, wherein the conductive portion further includes:

a fourth conductive pattern spaced apart from the second conductive pattern and disposed on an opposite side of the third conductive pattern with respect to the printed circuit board.

9. An electronic device comprising:

a housing;

a conductive frame; and an antenna structure including at least part of the conductive portion, wherein the conductive frame includes:

a first conductive pattern;

a second conductive pattern disposed to be coupled to the first conductive pattern; and a third conductive pattern disposed to be coupled to the first conductive pattern and spaced apart from the second conductive pattern, wherein the antenna structure includes:

a first feeding part connected to a first location adjacent to the second conductive pattern, in the first conductive pattern;

a second feeding part connected to a second location adjacent to the third conductive pattern, in the first conductive pattern;

a first ground part and a second ground part connected to a third location and a fourth location, respectively, between the first feeding part and the second feeding part of the first conductive pattern;

a closed loop switch electrically connected to a fourth portion location between the first feeding part and the two ground parts, such that the first feeding part and the second feeding part are connected at opposite ends of the first conductive pattern; and a third ground part connected to a fifth location adjacent to the first conductive pattern, in the second conductive pattern, wherein a first frequency band, to which a first signal transmitted and received by the first feeding part and the switch belongs, is higher lower than a second frequency band to which a second signal transmitted and received by the first feeding part and the two ground parts belongs.

10. The electronic device of claim 9, wherein the first ground part is close to the first feeding part, and the second ground part is close to the second feeding part, wherein a first current flow for transmitting and receiving the first signal in the first frequency band of 1.4 gigahertz (GHz) to 1.7 GHz is formed between the first feeding part and the first ground part, and wherein a second current flow for transmitting and receiving the second signal belonging to the frequency band of 1.8 GHz to 2.7 GHz is formed between the first feeding part and the third ground part.

11. The electronic device of claim 10, wherein the antenna structure further includes:

a third current flow for transmitting and receiving a third signal having a third frequency of 2.3 GHz to 2.5 GHz formed between the second feeding part and the second ground part.

12. The electronic device of claim 11, wherein the antenna structure further includes:

a fourth ground part connected to a portion adjacent to the first conductive pattern, in the third conductive pattern, and wherein a fourth current flow for transmitting and receiving a fourth signal of 4 GHz or more and 6 GHz or less is formed between the second feeding part and the fourth ground part.

13. The electronic device of claim 9, wherein the first frequency band to which the first signal transmitted and received by the first feeding part and the switch belongs is greater than or equal to 3 GHz and less than or equal to 7 GHz.

14. The electronic device of claim 9, wherein a distance between the first feeding part and the two ground parts is ¼ times a wavelength of a third signal transmitted and received by a current flow between the first feeding part and the two ground parts.

15. The electronic device of claim 9, wherein a distance between the first feeding part and the switch is 0.1 times a wavelength of a third signal transmitted and received by a current flow between the first feeding part and the two ground parts.

16. An electronic device comprising:
- a housing including a front plate, a rear plate facing away from the front plate, and a side member surrounding a space between the front plate and the rear plate and connecting one side of the front plate to one side of the rear plate, wherein at least part of the side member is a conductive portion;
- an antenna structure including at least part of the conductive portion; and
- a printed circuit board disposed in the space and including at least one processor,
- wherein the conductive portion includes:
  - a first conductive pattern;
  - a second conductive pattern disposed at least partially coupled to the first conductive pattern; and
  - a third conductive pattern disposed at least partially coupled to the first conductive pattern and spaced apart from the second conductive pattern,
- wherein the antenna structure includes:
  - a first feeding part electrically connected to a first location of the first conductive pattern;
  - a second feeding part electrically connected to a second location of the first conductive pattern, wherein the second location is closer to the third conductive pattern than the first location;
  - a first ground part electrically connected to a third location between the first location and the second location of the first conductive pattern;
  - a second ground part electrically connected to a fourth location between the second location and the third location of the first conductive pattern; and
  - a switch electrically connected to a fifth location between the first location and the third location of the first conductive pattern,
- wherein the first feeding part transmits and receives a signal in a first frequency band with the first ground part by forming a first current flow,
- wherein the second feeding part transmits and receives a signal in a second frequency band different from the first frequency band with the second ground part by forming a second current flow, and
- wherein the first feeding part transmits and receives a signal in a third frequency band different from the first frequency band and the second frequency band with the switch by forming a third current flow.

17. The electronic device of claim 16, wherein the antenna structure further includes:
- a third ground part electrically connected to a sixth location of the second conductive pattern, and
- wherein a fourth current flow for transmitting and receiving a signal in a fourth frequency band different from the first frequency band is formed between the first feeding part and the third ground part.

18. The electronic device of claim 17, wherein the antenna structure further includes:
- a third feeding part electrically connected to a seventh location of the second conductive pattern spaced further apart from the first conductive pattern than the sixth location; and
- another switch electrically connected to an eighth location of the second conductive pattern spaced further apart from the first conductive pattern than the seventh location.

19. The electronic device of claim 16, wherein the antenna structure further includes:
- a fourth ground part electrically connected to a sixth location of the third conductive pattern, and
- wherein a fourth current flow for transmitting and receiving a signal in a fourth frequency band different from the second frequency band is formed between the second feeding part and the fourth ground part.

20. The electronic device of claim 19, wherein the antenna structure further includes:
- a third feeding part electrically connected to a seventh location of the third conductive pattern spaced further apart from the first conductive pattern than the sixth location.

* * * * *